(12) United States Patent
Gidwani et al.

(10) Patent No.: US 10,749,049 B2
(45) Date of Patent: Aug. 18, 2020

(54) PRE-EQUILIBRIUM SYSTEM AND METHOD USING SOLID-STATE DEVICES AS ENERGY CONVERTERS USING NANO-ENGINEERED POROUS NETWORK MATERIALS

(71) Applicant: QuSwami, Inc., San Francisco, CA (US)

(72) Inventors: Jawahar M. Gidwani, San Francisco, CA (US); Andrew Lam, San Francisco, CA (US); Attila Horvath, Richmond, CA (US)

(73) Assignee: QuSwami, Inc., San Francisco, CA (US)

( * ) Notice: Subject to any disclaimer, the term of this patent is extended or adjusted under 35 U.S.C. 154(b) by 0 days.

(21) Appl. No.: 15/919,022

(22) Filed: Mar. 12, 2018

(65) Prior Publication Data
US 2018/0204963 A1    Jul. 19, 2018

Related U.S. Application Data

(63) Continuation of application No. 14/527,540, filed on Oct. 29, 2014, now abandoned.
(Continued)

(51) Int. Cl.
*H01M 14/00* (2006.01)
*H01M 4/86* (2006.01)
(Continued)

(52) U.S. Cl.
CPC .... *H01L 31/022425* (2013.01); *H01L 31/052* (2013.01); *H01L 41/113* (2013.01);
(Continued)

(58) Field of Classification Search
CPC ............ H01M 8/02; H01M 8/04; H01M 8/22; H01M 8/225; H01M 4/86; H01M 4/8605;
(Continued)

(56) References Cited

U.S. PATENT DOCUMENTS

| 5,034,288 A | 7/1991 | Bossel |
| 6,114,620 A | 9/2000 | Zuppero et al. |

(Continued)

FOREIGN PATENT DOCUMENTS

| EP | 1947721 A1 | 7/2008 |
| JP | 2013-219010 | 10/2013 |

(Continued)

OTHER PUBLICATIONS

Xiaozhong Ji, et al.; "The Catalytic Nanodiode: Gas Phase Catalytic Reaction Generated Electron Flow Using Nanoscale Platinum Titanium Oxide Schottky Diodes"; NANO Letters, 2005, vol. 5, No. 4, pp. 753-756; Department of Chemistry, University of California, Berkeley, California, and NeoKismet, LLC, 456 Montgomery Street, San Francisco, California.

(Continued)

*Primary Examiner* — Kenneth J Douyette
(74) *Attorney, Agent, or Firm* — Arnold & Porter Kaye Scholer

(57) ABSTRACT

An energy conversion device for conversion of various energy forms into electricity. The energy forms may be chemical, photovoltaic or thermal gradients. The energy conversion device has a first and second electrode. A substrate is present that has a porous semiconductor or dielectric layer placed thereover. The substrate itself can be planar, two-dimensional, or three-dimensional, and possess internal and external surfaces. These substrates may be rigid, flexible and/or foldable. The porous semiconductor or dielectric layer can be a nano-engineered structure. A porous conductor material is placed on at least a portion of the porous semiconductor or dielectric layer such that at least some of the porous conductor material enters the nano-engineered structure of the porous semiconductor or dielectric layer, thereby forming an intertwining region.

20 Claims, 21 Drawing Sheets

Related U.S. Application Data

(60) Provisional application No. 61/896,935, filed on Oct. 29, 2013.

(51) Int. Cl.
| | | |
|---|---|---|
| *H01M 4/90* | (2006.01) | |
| *H01M 8/22* | (2006.01) | |
| *H01L 31/02* | (2006.01) | |
| *H02N 2/18* | (2006.01) | |
| *H01L 31/0224* | (2006.01) | |
| *H01L 41/113* | (2006.01) | |
| *H02S 40/42* | (2014.01) | |
| *H01L 31/052* | (2014.01) | |
| *H01M 8/04007* | (2016.01) | |
| *H01M 4/92* | (2006.01) | |

(52) U.S. Cl.
CPC ....... *H01M 4/8605* (2013.01); *H01M 4/8626* (2013.01); *H01M 4/8647* (2013.01); *H01M 4/8652* (2013.01); *H01M 4/8657* (2013.01); *H01M 4/9075* (2013.01); *H01M 8/04067* (2013.01); *H01M 14/00* (2013.01); *H02N 2/18* (2013.01); *H02S 40/42* (2014.12); *H01M 4/9025* (2013.01); *H01M 4/92* (2013.01); *H01M 4/925* (2013.01); *H01M 8/22* (2013.01); *H01M 8/225* (2013.01)

(58) Field of Classification Search
CPC ... H01M 4/8626; H01M 14/00; H01L 31/052; H01L 31/02245
See application file for complete search history.

(56) References Cited

U.S. PATENT DOCUMENTS

| | | |
|---|---|---|
| 6,218,608 B1 | 4/2001 | Zuppero et al. |
| 6,222,116 B1 | 4/2001 | Zuppero et al. |
| 6,268,560 B1 | 7/2001 | Zuppero et al. |
| 6,327,859 B1 | 12/2001 | Zuppero et al. |
| 6,649,823 B2 | 11/2003 | Zuppero et al. |
| 7,371,962 B2 | 5/2008 | Zuppero et al. |
| 7,663,053 B2 | 2/2010 | Zuppero et al. |
| 2006/0194098 A1 | 8/2006 | Chang et al. |
| 2008/0280169 A1 | 11/2008 | Niu et al. |
| 2010/0040921 A1* | 2/2010 | Aoto ............... H01M 8/2415 429/405 |
| 2010/0304204 A1 | 12/2010 | Routkevitch et al. |

FOREIGN PATENT DOCUMENTS

| | | |
|---|---|---|
| WO | 2007061945 A2 | 5/2007 |
| WO | 2013084825 A1 | 6/2013 |

OTHER PUBLICATIONS

Xiao Z. Ji, et al.; "Continuous Hot Electron Generation in Pt/TiO2, Pd/TiO2, and Pt/GaN Catalytic Nanodiodes from Oxidation of Carbon Monoxide"; J. Phys. Chem. B 2005, 109, 22530-22535; 2005 American Chemical Society; Department of Chemistry, University of California, Berkeley, California.

Japanese Office Action dated Oct. 9, 2018 in Japanese Appln. No. 2016-526761.

Japanese Office Action dated Jul. 30, 2019 in Japanese Appln. No. 2016-526761.

\* cited by examiner

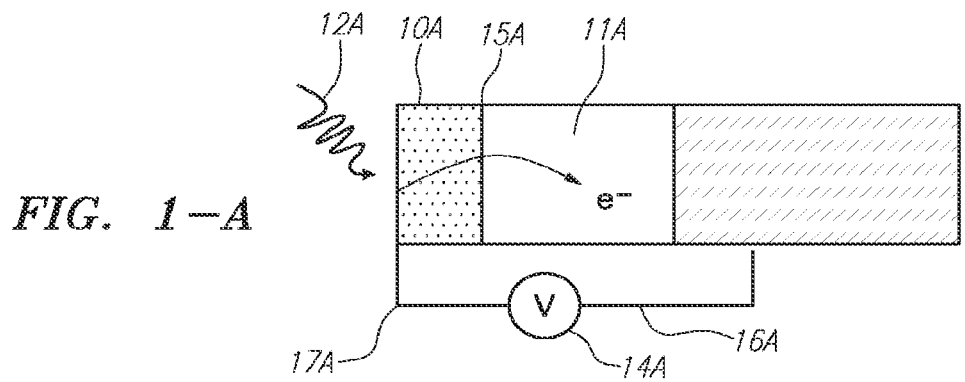
FIG. 1-A
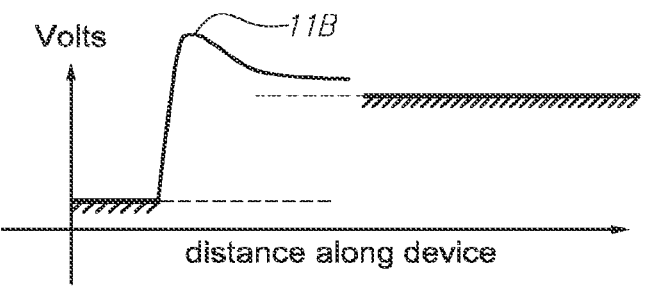
FIG. 1-B
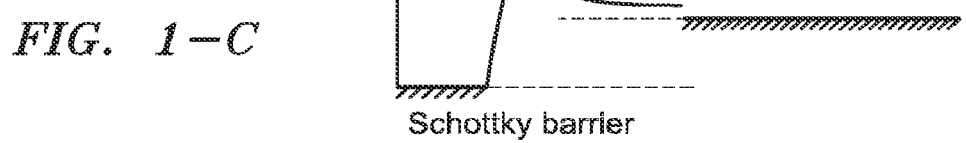
FIG. 1-C
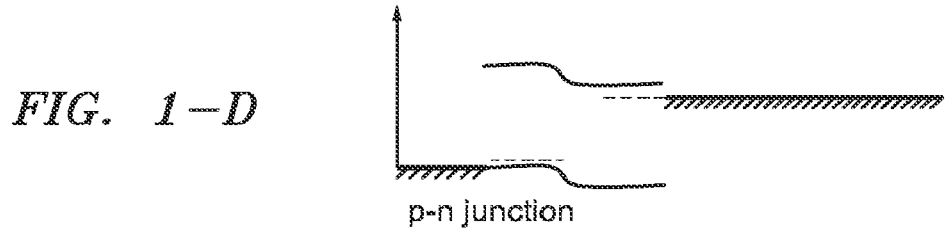
FIG. 1-D
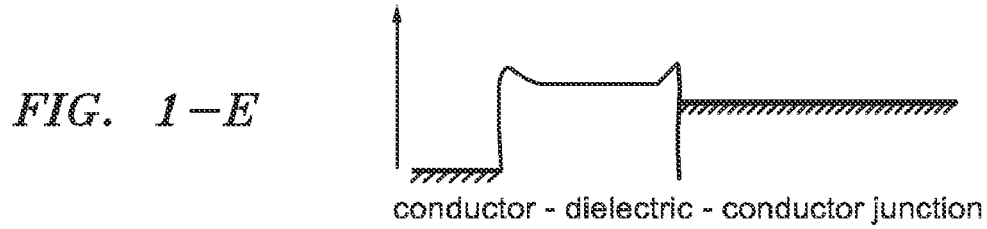
FIG. 1-E
FIG. 1

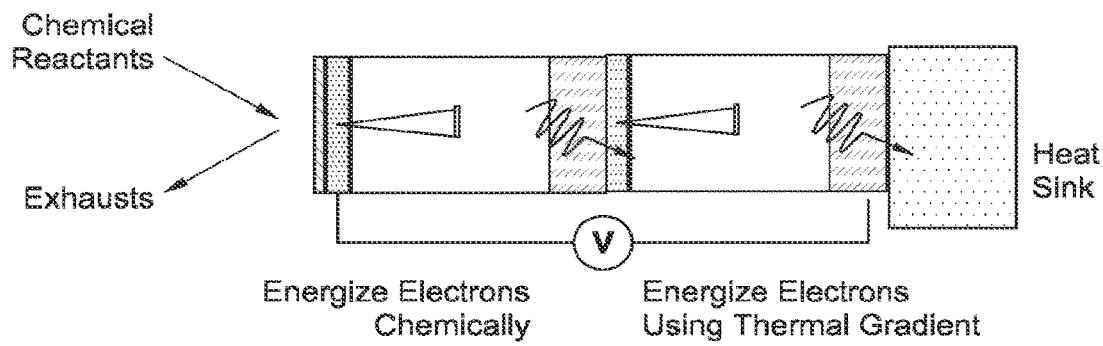
FIG. 11-A
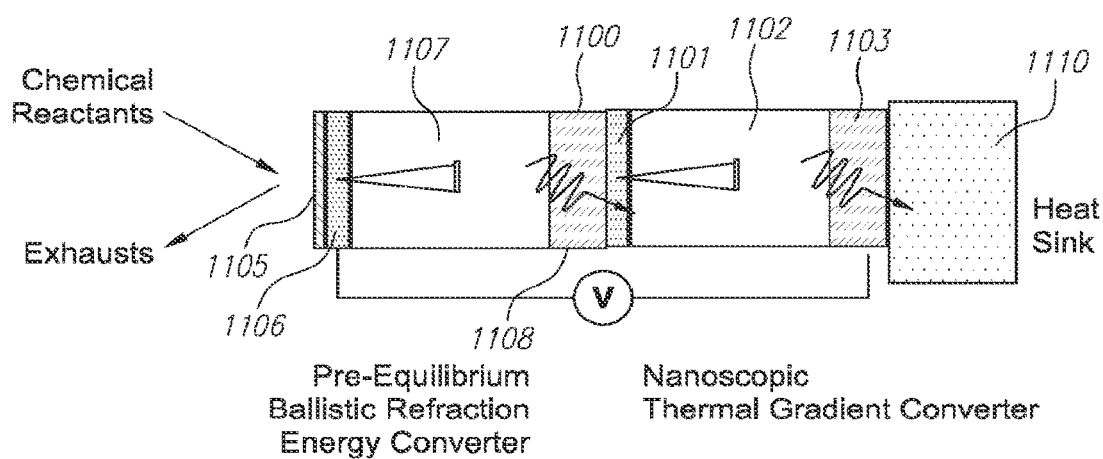
FIG. 11-B
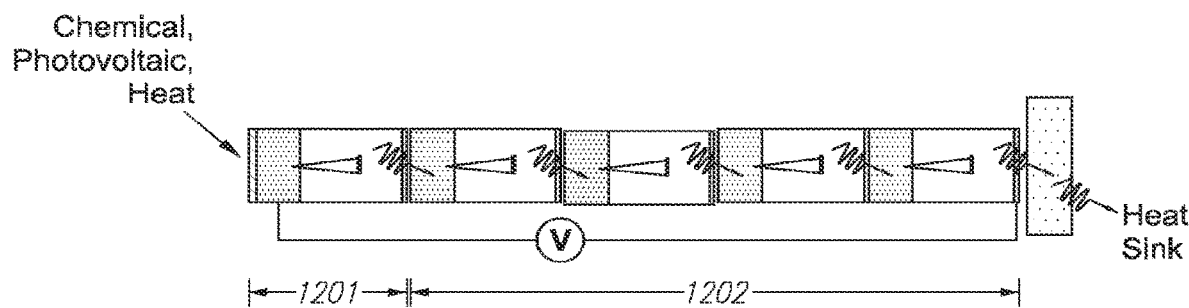
FIG. 12

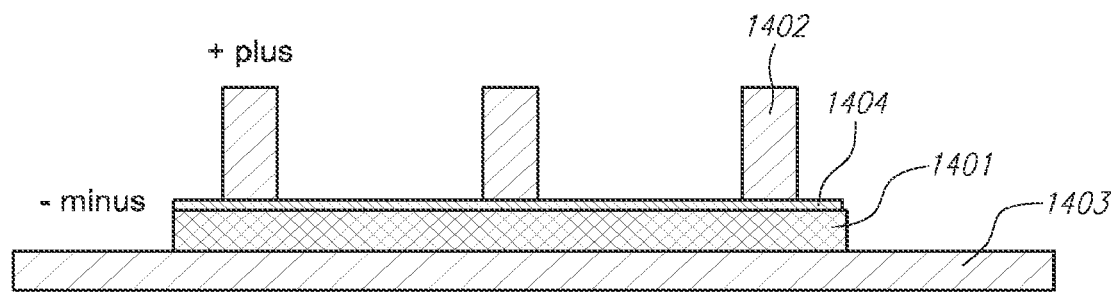
FIG. 14-A
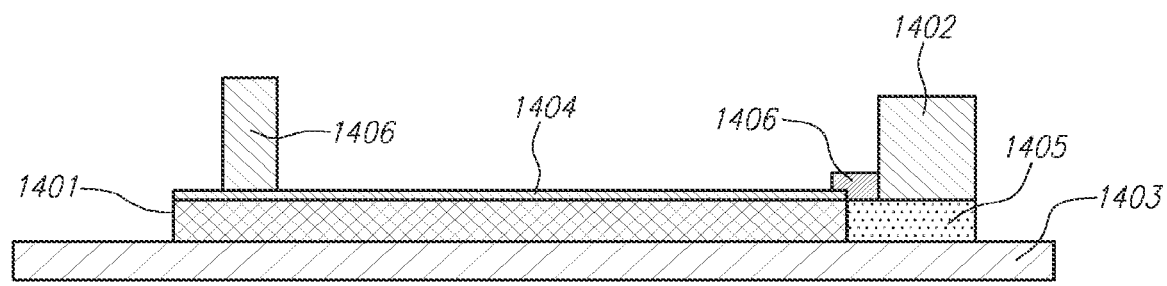
FIG. 14-B

Simple stacking, end view

PRE-EQUILIBRIUM SYSTEM AND METHOD USING SOLID-STATE DEVICES AS ENERGY CONVERTERS USING NANO-ENGINEERED POROUS NETWORK MATERIALS

CROSS-REFERENCE TO RELATED APPLICATION

This application is a continuation of U.S. application Ser. No. 14/527,540, now abandoned, filed Oct. 29, 2014, which claims the benefit of U.S. Provisional Application No. 61/896,935, filed Oct. 29, 2013, each of which are hereby incorporated by reference in the entirety.

FIELD

This patent document relates generally to energy conversion systems and more particularly relates to a method and system for generating electrical power, beams of radiation or mechanical motion using solid-state electric generators with planar or three dimensional surfaces that comprise porous material networks such as a nano-wire arrays or nano-engineered structures, or nano-particles, or colloidal paste.

BACKGROUND

The use of solid state electric generators to convert chemical energy and other energy forms into electricity has recently been demonstrated, as explained, for example, in U.S. Pat. Nos. 6,114,620, 6,218,608, 6,222,116, 6,268,560, 6,327,859, 6,649,823, 7,371,962, and 7,663,053. U.S. Pat. Nos. 6,114,620, 6,218,608, 6,222,116, 6,268,560, 6,327,859, 6,649,823, 7,371,962, and 7,663,053 are hereby incorporated herein by reference in their entirety. Such energy conversion devices efficiently convert chemical and other energy forms. For example, FIG. 1 herein illustrates a solid-state electric generator along with graphs showing characteristics of such a device. As shown in cross section in FIG. 1-A herein, a charge carrier, usually an electron $e^-$, is energized on or near a conducting surface 10A by an energizer 12A. The charge carrier is energized, for example, by chemical reactions or other energy forms. In each case the charge carrier is injected into a semiconductor conduction band. For example, the charge carrier ballistically moves from a conductor 10A into a semiconductor or dielectric 11A. The conductor 10A is so thin that the electron effectively travels through it ballistically, without losing significant energy by colliding with other electrons, phonons or atoms. Since an energy offset exists between the semiconductor conduction band and the Fermi level of the conductor or conducting catalyst, the result is a voltage 14A across positive terminal 17A and negative terminal 16A. In FIG. 1-A, the dielectric junction 15A is a semiconductor junction specifically chosen to create an electrical potential voltage barrier which tends to impede the electron ballistic motion, shown as 11B in FIG. 1-B. FIG. 1-B shows the electrical potential in the device as a function of distance along the device at zero bias.

The potential voltage barrier can be formed in any one of many ways, for example, a Schottky barrier as shown in FIG. 1-C, a p-n junction in FIG. 1-D, or a conductor-dielectric-conductor junction, FIG. 1-E. The dielectric is electrically conductive. A forward biased diode provides one of the simplest methods to implement this energy converting device. FIG. 1-C depicts a forward biased Schottky diode whose positive terminal is a conductor/metal.

SUMMARY

The present patent document describes various embodiments having novel three dimensional device structures that can be on a planar two-dimensional substrate or on a three-dimensional substrate. The two-dimensional or three-dimensional substrates can be rigid or flexible/foldable. The various embodiments improve on earlier solid-state electric generators by increasing amount of power (i.e., electricity) that can be produced per unit of two-dimensional area of a device. The novel device structures described herein have solid-state junctions. These device structures comprise porous semiconductor or dielectrics and nano-clusters of conductor and/or catalyst to form the solid-state junctions. Even though there are voids in the composite system, different porous semiconductor/conductor or conducting catalyst materials, as an example, can be an integrated system or the materials may be physically connected as a network. Nano-clusters are when materials form nano-sized clusters. The solid-state junctions can be, but are not limited to, Schottky diodes or p-n junctions. Also disclosed are methods/processes to fabricate the disclosed device structures for generating electricity or other energy forms.

An energy conversion device for conversion of chemical energy into electricity or other energy forms is disclosed. A first aspect of the energy conversion device comprises a first electrode connected to a substrate. A porous semiconductor (or dielectric) layer is disposed over the substrate (with an optional non-porous semiconductor (or dielectric) layer being in-between the substrate on the porous semiconductor (or dielectric) layer. The porous semiconductor layer has a nano-engineered structure. A porous catalyst material is located on at least a portion of the porous semiconductor (or dielectric) layer. At least some of the porous catalyst material enters the nano-engineered structure of the porous semiconductor layer, which forms an intertwining region. A second electrode is present, and an electrical potential is formed between the first electrode and a second electrode during chemical reactions between a fuel, the porous catalyst material, and the porous semiconductor layer. A heat sink that removes heat from the solid state electric generator is also present, where the heat sink has a heat sink temperature higher than an ambient temperature.

In another aspect disclosed herein, the substrate of the energy conversion device is patterned to create a three-dimensional surface, thereby providing increased surface area for chemical reactions.

In another aspect disclosed herein, the substrate of the energy conversion device is patterned such that nano-wires are formed.

In another aspect disclosed herein, the substrate of the energy conversion device is textured such that peaks and valleys are formed.

In another aspect disclosed herein, the energy conversion device has a non-porous semiconductor layer in between the substrate and the porous semiconductor layer.

In another aspect disclosed herein, the substrate of the energy conversion device is two-dimensional and planar.

In another aspect disclosed herein, the substrate of the energy conversion device is three-dimensional and possessing internal and external surfaces.

In another aspect disclosed herein, the substrate of the energy conversion device is rigid.

In another aspect disclosed herein, the substrate of the energy conversion device is flexible.

In another aspect disclosed herein, the substrate of the energy conversion device is foldable.

In another aspect disclosed herein, the solid-state junction is a Schottky diode.

In another aspect disclosed herein, the solid-state junction is a p-n junction.

In another aspect disclosed herein, the solid-state junction is a conductor-dielectric, dielectric-dielectric, conductor-dielectric-conductor, or a dielectric-conductor-dielectric junction.

In another aspect disclosed herein, the porous semiconductor layer comprises a semiconductor material chosen from a materials group including crystalline, polycrystalline, or porous $TiO_2$, $SrTiO_3$, $BaTiO_3$, $Sr_{1-x}Ba_yTiO_z$, boron carbide, $LiNiO$, $Al_2O_3$, $ZnO$, and $LaSrVO_3$, and organic semiconductors comprising PTCDA, or 3,4,9,10-perylenetetracarboxylicacid-dianhydride.

In another aspect disclosed herein, the nanoscopic conductor cluster has discontinuous porous coverage over the porous semiconductor layer.

In another aspect disclosed herein, the conductor layer comprises a plurality of nanoscopic clusters.

In another aspect disclosed herein, the nanoscopic cluster comprises a catalyst.

In another aspect disclosed herein, the one or more energy conversion devices are connected electrically in series, electrically in parallel, or combinations of series and parallel.

In another aspect disclosed herein, the one or more energy conversion devices are connected thermally in series, thermally in parallel, or combinations of series and parallel.

In another aspect disclosed herein, the energy conversion system comprises buss bars on the active surface of one or more energy conversion devices with dimensions greater than the tunneling dimension.

The solid-state generators can be energized by chemical reaction energy, photovoltaics or thermal gradients, and it can be fabricated on a rigid substrate or on a flexible/foldable substrate. The device to generate mechanical motion from chemical reaction energy consists of placing a hydraulic fluid in contact with the non-reaction side of the nano-engineered structures, with the surfaces of both the conductor/catalyst and the nano-engineered structures mechanically formed to enhance the unidirectional forces on the fluid. Other methods such as nano-tubes may also be used to convert to mechanical energy. The apparatus converts a substantial fraction of the reaction product energy into useful work during the brief interval before such products equilibrate with their surroundings. The present invention relates to the extraction of electrical or mechanical energy or coherent radiation, from chemical reactions occurring on the surface of a catalyst before thermal equilibrium has been reached, by the forms of the released energy.

BRIEF DESCRIPTION OF THE DRAWINGS

The accompanying drawings, which are included as part of the present specification, illustrate various embodiments and together with the general description given above and the detailed description of the embodiments given below serve to explain and teach the principles described herein.

FIG. 1-A illustrates a solid-state electric generator.

FIG. 1-B illustrates a graph of potential energy versus distance from the device's topmost surface and indicating the effect of a potential barrier in a solid-state junction.

FIG. 1-C illustrates a graph of potential versus distance from the device's topmost surface in an exemplary solid-state electric generator having a Schottky barrier.

FIG. 1-D illustrates a graph of potential versus distance from the device's topmost surface in an exemplary solid-state electric generator having a p-n junction potential barrier.

FIG. 1-E illustrates a graph of potential versus distance from the device's topmost surface in an exemplary solid-state electric generator having a conductor-dielectric-conductor potential barrier.

FIG. 9b is a microscopic image of a cross section of an exemplary three-dimensional energy converter on a three-dimensional textured substrate as in FIG. 9a.

FIG. 9c is a microscopic image of a top view of an exemplary three-dimensional energy converter on a three-dimensional textured substrate as in FIG. 9a.

FIGS. 11(a) and 11(b) show a primary and secondary energy converter connected in series thermally and electrically where the primary and secondary converter may be energized by the same or different energy sources.

FIG. 12 shows several exemplary energy converters connected thermally and electrically.

FIG. 14-A illustrates an exemplary cross-section showing inert spacers formed along with solid-state energy converter assemblies on a supporting substrate.

FIG. 14-B illustrates an exemplary cross section detail of a spacer and solid-state energy converter assemblies on a supporting substrate.

Figure 2:
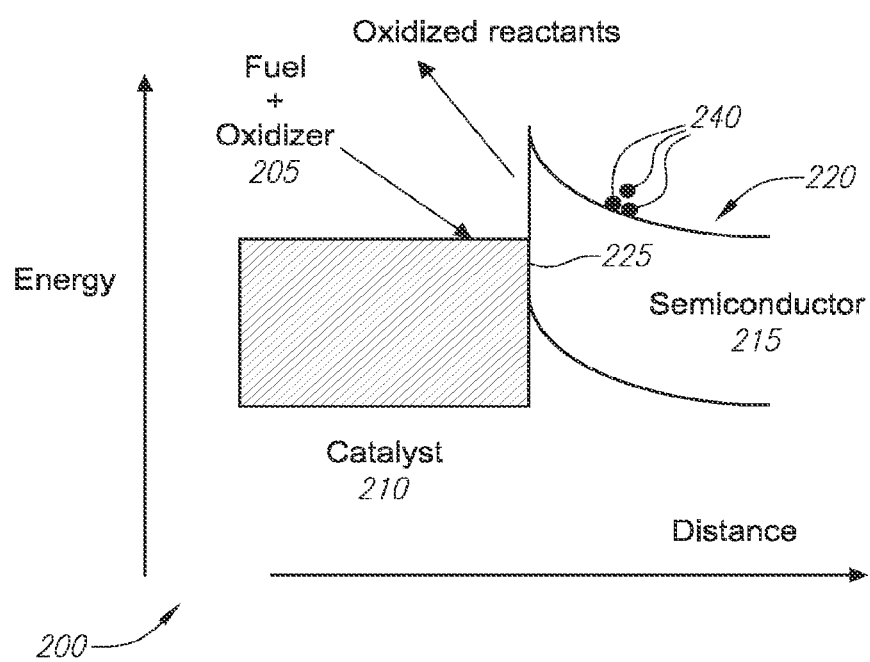
FIG. 2 illustrates the energy band diagram for a conductor and/or catalyst-semiconductor interface

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

DETAILED DESCRIPTION

A method and apparatus for generating electricity and or converting to other energy forms is described. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the FIGS. are designed to help to understand how the present teachings are practiced, but not intended to limit the dimensions and the shapes shown in the examples.

Additional embodiments connect solid-state converters thermally in parallel and/or in series and connect them electrically in parallel and/or in series. The connected converters are further connected in parallel and/or in series. The thermal connections can be physically distinct from the electrical connections. The energy and heat sources include those with unique, spatially non-uniform temperature profiles, temporally sporadic and non-constant energy bursts, and various regions may present non-uniform heat flow rates.

The various embodiments described herein are solid-state devices that convert different energy forms to electricity or other energy forms. A limiting factor of prior devices using similar electron transport mechanisms as those described herein was the surface area that produced power per unit two-dimensional area of the device. The various embodiments described herein overcome these problems by increasing the surface area of the solid-state energy converter device without significantly increasing the two-dimensional area of such devices.

Energizing methods include using chemical reaction energies, photovoltaic methods, using propagating and/or evanescent electromagnetic radiation, using electric coulomb coupling, using heat flow and associated thermal gradients, using solar energizers, using heat sources such as geothermal, friction, and nuclear heat sources, using nuclear energizing, using in-situ ionizing radiation, using radioactive waste radiation, using flame heaters and catalytic heaters, using thermo-electric and Seebeck effect, and using piezo-electric energizing.

Device structures and methods/processes described herein, for example, in FIGS. 4-9, include but are not limited to: (a) nanowires, nanofibers, or nanotubes; (b) porous nano-engineered structures with interconnecting walls and pores; and (c) porous nano-engineered structures with percolating networks. Fabrication methods/processes include but are not limited to direct film growth resulting in porous structures or/and nano-engineered structures. Methods of fabricating such devices include but are not limited to (i) stain oxidation and etching; (ii) dry and/or wet oxidation and etching; (iii) electrochemical oxidation and etching; (iv) anodization oxidation and etching; (v) micro-arc oxidation and etching; nano-particles of semiconductor(s), dielectric(s), metal(s), conductor(s), and/or catalyst which can be conducting catalysts, metal salts in solvents, pastes, or colloids; and (vi) solgel processes. For certain semiconductors and dielectrics, e.g., silicon, only etching is required for all these fabrication methods/processes to introduce porosity and nano-engineered structures in the materials.

In certain embodiments, a chemical energy conversion device is described that utilizes porous semiconductor or dielectric and porous conductor and/or catalyst, which can be a conducting catalyst, integrated one unit/network on a planar two-dimensional substrate or a three-dimensional substrate. The two-dimensional or three-dimensional substrates can be rigid or flexible/foldable. A porous thin film of dielectric or semiconductor, such as a titanium dioxide ($TiO_2$), which is sometimes referred to as titanium oxide, semiconducting network, as an example, can be fabricated by depositing a thin film of metallic titanium (Ti) on a non-porous planar substrate such as silicon, or on a non-porous supporting layer deposited on a planar substrate, such as a non-porous $TiO_2$ layer on silicon. This deposited thin metallic Ti film can subsequently be oxidized to create $TiO_2$ and further modified to form nano-porous holes in its microstructure through (i) stain oxidation and etching, (ii) dry or wet oxidation and etching, (iii) electrochemical oxidation and etching, (iv) anodization oxidation and etching, or (v) microarc oxidation and etching. Chemical reagents involved in all these processes include but are not limited to hydrofluoric acid (HF), nitric acid ($HNO_3$), sulfuric acid ($H_2SO_4$), hydrogen peroxide ($H_2O_2$), or/and sodium hydroxide (NaOH). An additional non-porous layer of material functioning as a barrier layer can also be inserted between the deposited metallic Ti thin film and the planar substrate in order to further enhance device electrical performance. In another example the substrate itself can be a three-dimensional structure such as but not limited to porous silicon, textured silicon surfaces, and patterned silicon wafers. Likewise an additional non-porous thin layer of semiconductor or dielectric such as $TiO_2$ may be inserted between the metallic Ti layer and the three-dimensional substrate described above. As another example, the integration of porous conductors and/or catalysts, which can be conducting catalysts, and porous semiconductors or dielectrics can be fabricated on the two-dimensional or three-dimensional substrate via the printing techniques or spin-coating using nano-particles of conductor/catalyst, semiconductor, and dielectrics.

Although the various embodiments disclosed herein are described as using $TiO_2$, wherever $TiO_2$, is discussed, other materials such as thin films of porous semiconductors and dielectrics with nano-engineered structures can be used without departing from the teachings herein. Such other thin-film porous materials include but are not limited to silicon; $Al_2O_3$; GaN; GaAs; Ge; ZnO; silica; carbon; oxides of niobium, tantalum, zirconium, cerium, tin, and vanadium. These materials also apply to the underneath planar and three-dimensional substrates or supporting layers. The same processing methods can also be used in device fabrications.

As will be discussed, catalysts and/or conductors are placed on the internal and external surfaces of the porous semiconductor to create a plurality (and preferably, and large number) of solid-state junctions. The catalysts and/or conductors that can be used to form the solid-state junctions with the porous nano-engineered semiconductor or dielectric network(s) can be noble or other metals such as but are not limited to Pt, Au, or Pd. These conductors and/or catalysts can be deposited using a number of methods, including but not limited to using nanoparticles or/and metal salts in solvents, pastes, or colloids; thin film deposition followed by annealing to nucleate the formation of nanoparticles or a combination of pastes/solvent/deposition methods; chemical vapor deposition (CVD); sputtering; evaporation; atomic layer deposition (ALD); or solgel processes.

Turning to FIG. 2, a mechanism for energy conversion is described. FIG. 2 depicts an energy band diagram 200 for a catalyst-nanowire interface for an energy conversion device. Charge carrier energizer 205 comes into contact with the catalyst and/or catalyst conductor 210. The charge carrier energizer 205 (in this case being a chemical reactions energizer comprising fuel and air) injects electrons 240 into the conduction band 220 of the semiconductor 215. There, the electrons 240 encounter a Schottky-like potential barrier 225 between the semiconductor 215 and the conductor 210, and may also be a top electrode layer (not shown) that embeds the conductor. The electrons 240 are then directed towards the bottom contact (not shown) by the built-in electric field at the interface between the conductor 210 and the semiconductor 215. The electrons 240 travel in the external circuit (not shown), thereby transferring their energy to the load before returning to the catalyst/conductor site via the top contact (also not shown). The output voltage of the circuit shown in FIG. 2 will depend on the potential offset (barrier) between the Fermi level in the catalyst/conductor and the conduction band of the semiconductor.

Figure 3:
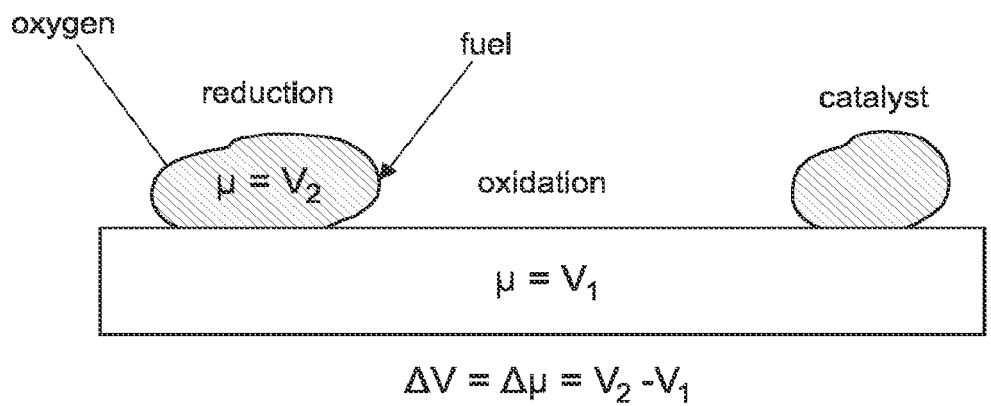
FIG. 3 illustrates the schematics of EMF generation mechanism

In other words, as schematically shown in FIG. 3, the oxidation-reduction (redox) reactions induce an electron's chemical potential difference between the catalyst sites and the semiconductor sites, which in turn gives rise to an EMF ($\Delta A = V_2 - V_1$).

In one embodiment described herein are chemical energy conversion devices that convert chemical energy to electricity. A limiting factor of prior devices using similar electron transport mechanisms as those described herein was the rate at which catalytic reactions could take place. Electricity generation of chemical energy converter devices like those described herein is proportional to the reaction rate and fuel conversion, and the reaction rate and fuel conversion are proportional to at least (i) the temperature at which the catalytic reactions take place, and (ii) the total surface areas of the catalyst. Increasing the surface area, however, generally leads to devices that become large two-dimensionally, and thus increases the size of the device, which is undesirable. Likewise, temperatures can be increased to enhance reaction rate, but increasing temperature can also be undesirable. The various embodiments described herein overcome these problems by increasing the surface area of the chemical energy converter device without significantly increasing the two-dimensional area of such devices.

Figure 4:
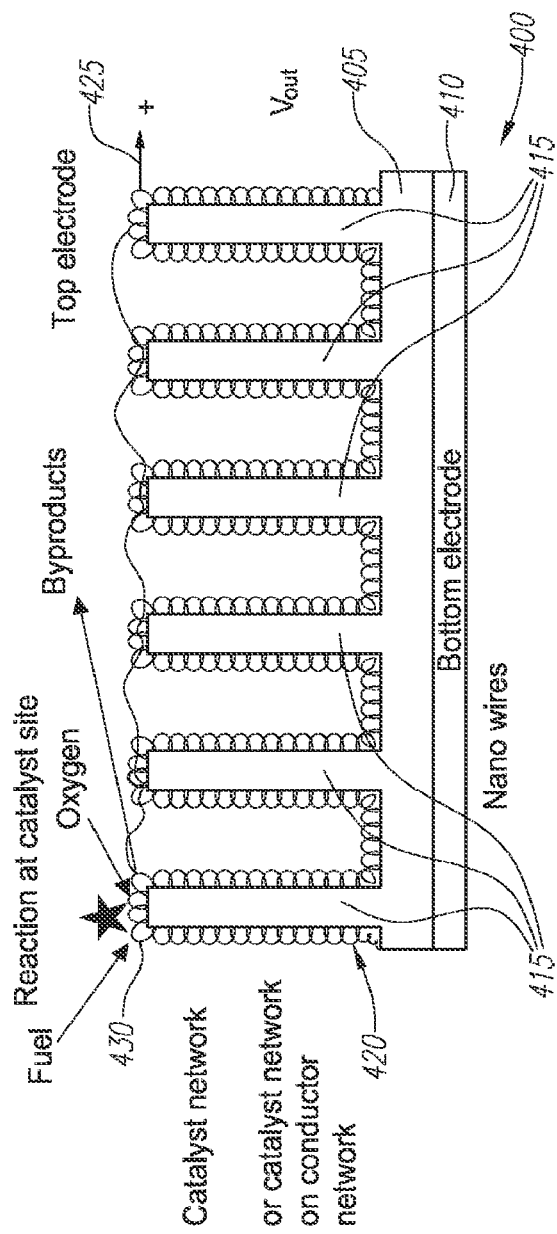
FIG. 4 illustrates a schematic cross-section of a portion of a nanowire material array with a conductor and/or catalyst, which can be a conducting catalyst network.

FIG. 4 illustrates an embodiment of a chemical energy converter device 400. In particular, FIG. 4 illustrates a device having nanowires 415, which are formed on a substrate layer (not shown), where the substrate layer can comprise a porous thin film of dielectric or semiconductor, such as a titanium oxide ($TiO_2$). The substrate layer is formed on an electrode 410, which can be made with a metal conductive material or highly n-doped semiconductor material. Electrode 410 can be below the substrate layer or in-between the substrate and the nanowires 415. Nanowires 415 can comprise either a nano-engineered porous semiconductor material or a nano-engineered porous dielectric. Either way, nanowires 415 form an electrically conductive array. Conducting material 420 is on the surface of the nanowire 415, although intervening materials are possible as well. The conducting material 420 can be metal particles, where each metal particle forms a Schottky diode junction with the semiconductor material forming the nanowires 415. In use, energizing source 430 such as hydrogen, or methanol or natural gas, and air, or a monopropellant energy source or fuel such as hydrogen peroxide comes in contact with the catalyst 420, which causes electrons from the conductor 420 to be injected into the semiconductor 405, which are then attracted to the electrode 410. This generates electricity. A second electrode 425 is formed over the catalyst/conductor 420, which, in conjunction with the bottom electrode 410 allows a circuit to be formed so that electrical current will flow and a voltage potential $V_{out}$ is generated between the electrodes.

Nanowires 415 provide several advantages that improve the overall efficiency. The nanowires 415 have surface area, meaning that each nanowire 415 provides significantly more surface area than the same two-dimensional area would have provided were no nanowire 415 present. The additional surface area provided by the nanowires allows more catalyst/conductor material to be deposited on the nanowires when compared to energy conversion devices where the catalyst deposition is two-dimensional. The presence of catalyst nano-particles, nano-clusters, on nano-wires provide more reaction sites for chemical reactions leading to increased reaction/conversion rates at lower temperatures. Another advantage is that porous network also facilitates diffusion of reactants to catalysts located on the internal surfaces of the nanowires and removal of reaction products away from the catalysts.

In an embodiment, nanowires 415 are comprised of single crystal $TiO_2$ nanowires, which enhance electron transport, can be synthesized in various simple inexpensive methods, such as growth from an epitaxial seed layer from a titanium source e.g. in a hydrothermal process. The bottom contact 410 is a conductive substrate with a conductive layer that provides an epitaxial template for nanowire growth, e.g. FTO (fluorinated tin oxide) in the case of $TiO_2$ nanowires. The top contact 425 has to electrically connect the porous network of the catalyst/conductor. The catalyst/conductor can be a paste or an electrolyte. Again, the conductor and or catalysts can be deposited using nano-particle pastes, nano-particle solvents, thin film depositions or any combinations thereof.

Figure 5A:
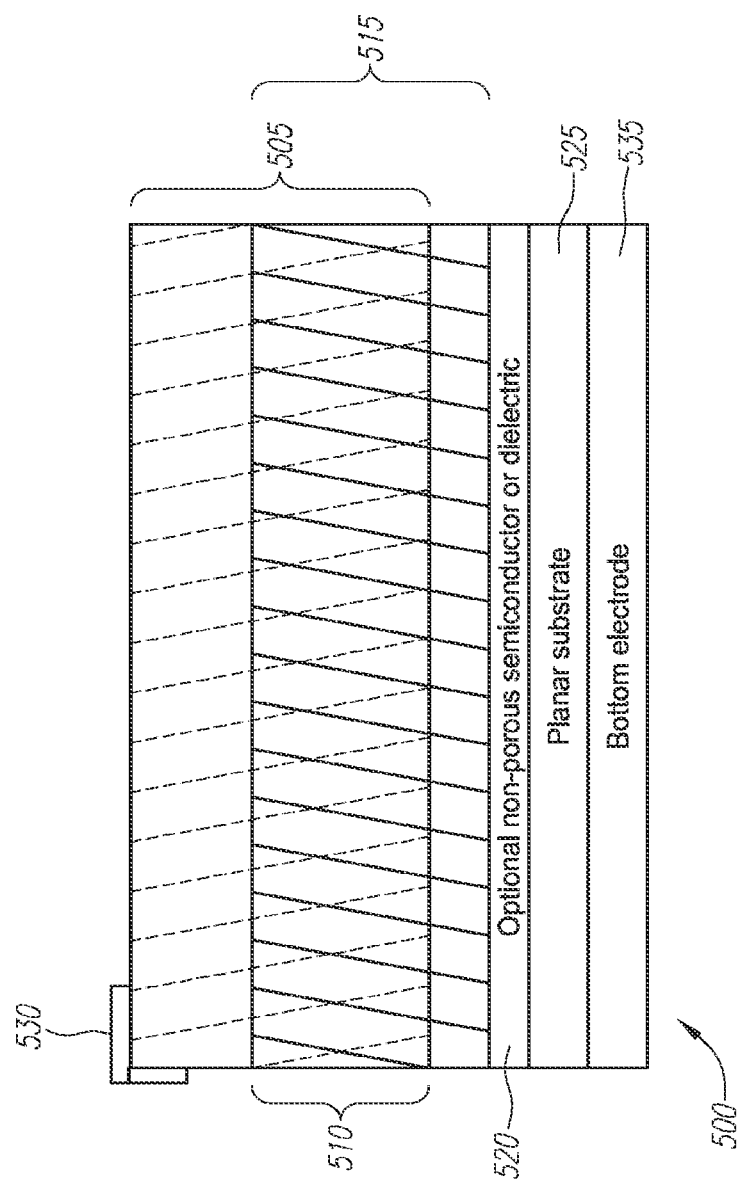
FIG. 5a depicts a cross-sectional view of a three-dimensional porous network which consists of a porous conductor and/or catalyst which can be a conducting catalyst three-dimensional layer that intertwines three-dimensionally with another porous semiconductor or dielectric three-dimensional layer on a planar two-dimensional substrate. A non-porous interlayer can optionally be inserted between the planar substrate and the porous three-dimensional layers/networks above.
Figure 5B:
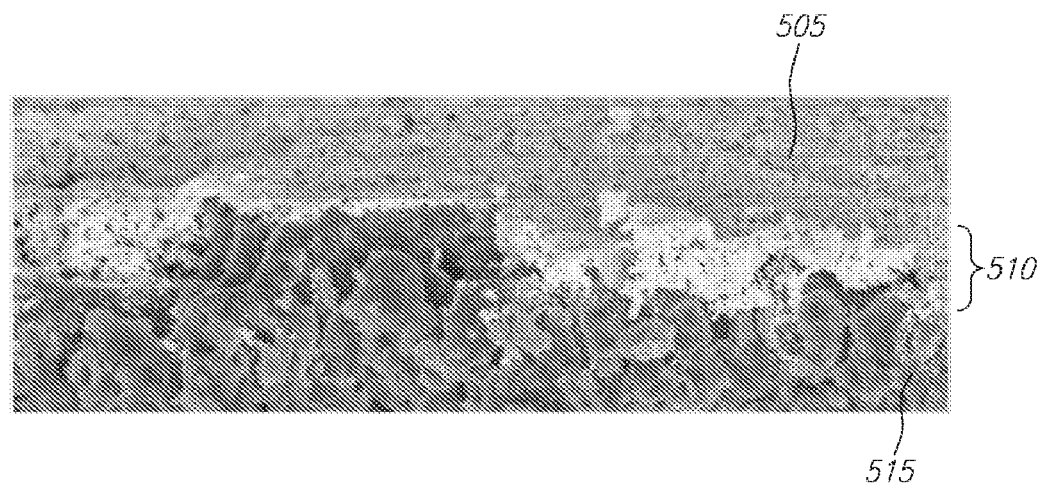
FIG. 5b is a cross-sectional microscopic view of a three-dimensional porous network, which consists of a porous conductor and/or catalyst which can be a conducting catalyst three-dimensional layer that intertwines three-dimensionally with another porous semiconductor or dielectric three-dimensional layer.
Figure 5C:
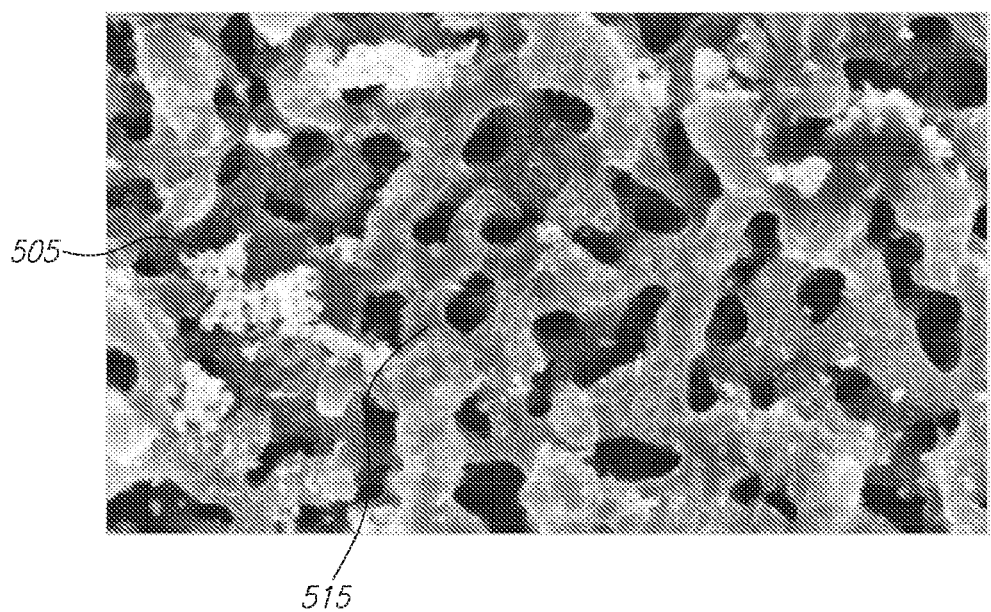
FIG. 5c is a top microscopic image of an energy converter having a three-dimensional porous network, which consists of a porous conductor and/or catalyst which can be a conducting catalyst three-dimensional layer that intertwines three-dimensionally with another porous semiconductor or dielectric three-dimensional layer.

FIG. 5a illustrates another embodiment of an energy converter device comprising a three-dimensional porous catalyst/conductor layer 505 intertwined three-dimensionally with porous semiconductor or dielectric layer 515 at an intertwining region 510, which in turn can be placed on a planar substrate 525. Layer 515 can be constructed with $TiO_2$ as discussed above, and can take the form of a honeycomb-like structure being either a nano-engineered structure having interconnecting walls defining pores, or nano-engineered structures with percolating networks. Either way, the honeycomb-like structure allows catalyst nano-particles from the catalyst layer 505 to enter the spaces of the honeycomb structure and rest on the surface of the semiconductor or dielectric layer 515. It is this honeycomb structure that makes layer 515 porous in three dimensions. These nano-particles can, for example, be platinum or any metal. The honeycomb-like structure of the semiconductor or dielectric layer 515 can be seen in the microscopic images of FIGS. 5b-5c.

Likewise, the three-dimensional porous catalyst layer 505 can comprise porous networks, individual nano-clusters/particles, or a combination of both, and can be constructed from, for example, platinum. As with porous semiconductor or dielectric layer 515, catalyst/conductor layer can take the form of a honeycomb-like structure. Optionally, it can be a mesh or continuous system acting as the top electrode. An exemplary three-dimensional porous layer 505 can be seen in the microscopic images of FIGS. 5b-5c. A feature of the intertwining region 510 is its large internal surface area where catalyst/conductors can be distributed throughout to construct a three-dimensional network of catalyst/conductor-semiconductor junctions. An exemplary intertwining region 510 can be seen in the microscopic images of FIGS. 5b-5c.

An energy converter 500 can optionally include a non-porous semiconductor or dielectric layer 520 deposited through standard deposition methods such as evaporation, chemical vapor deposition (CVD), sputtering, or atomic layer deposition (ALD), to provide a barrier layer between the substrate below and the porous materials above.

In the embodiment illustrated by FIG. 5(a), a top electrode 530 can be formed on part or all of catalyst/conductor layer 505. Likewise, a bottom electrode 535 can be formed underneath planar substrate 525. These two electrodes can be electrically connected to an external load to form a complete circuit.

Figure 6:
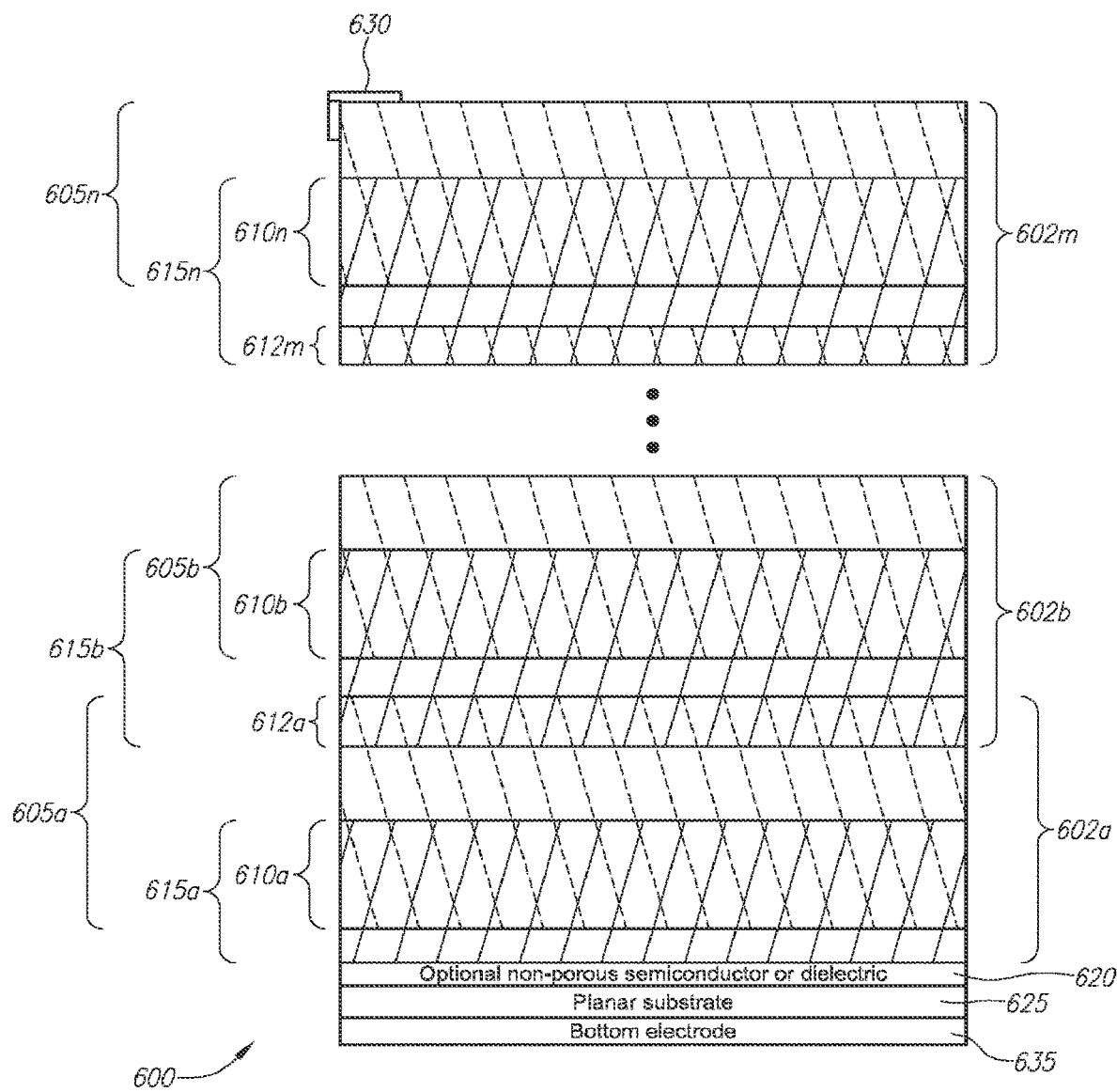
FIG. 6 shows an energy converter having a multi-cell device structure with multiple layers of three-dimensional porous conductor and/or catalyst, which can be a conducting catalyst, and three-dimensional porous semiconductor or dielectric networks on a planar substrate. A non-porous interlayer can be inserted or not between the planar two-dimensional substrate and the porous three-dimensional layers/networks above.

FIG. 6 shows yet another embodiment, where a plurality of an energy converter devices 500 as in FIG. 5(a) are arranged as n cells 602a-602n and are thus stacked on top of each other. A chemical energy converter 600 as shown in FIG. 6 is a multi-cell device structure with multiple layers of porous catalyst 605a-605n and porous semiconductor/dielectric networks 615a-615n that can be fabricated and integrated vertically on a planar two-dimensional substrate. In particular, chemical energy converter 600 can have a bottom electrode 635, which has a planar substrate 625 disposed thereon. A non-porous semiconductor or dielectric layer 620 can, if desired, be placed on the planar substrate 625. Use of such a layer 620 acts as a barrier layer between substrate below and the porous materials above. The first cell 602a of the chemical energy converter 600 comprises a porous layer 615a comprised of a semiconductor or dielectric material, which can be constructed, for example, from $TiO_2$. The first cell 602a also comprises a three-dimensional porous catalyst layer 605a that is placed thereon using methods described above, and can comprise porous networks, individual nano-clusters/particles, or a combination of both. Catalyst layer 605a can be constructed from, for example, platinum. At the interface between layer 615a and catalyst layer 605a, the materials intertwine three-dimensionally in a first intertwined region 610a.

To increase the amount of electricity generated, chemical energy converter device 600 has additional cells 602b through 602n stacked on top of each other. For example, a second cell 602b comprised of second porous semiconductor or dielectric layer 615b and second catalyst layer 605b are formed above the first cell, with a three-dimensional intertwined region 612a formed between the first cell 602a and second cell 602b. Likewise a third three-dimensional intertwined region 610b is formed between the second catalyst layer 605b and second porous semiconductor or dielectric layer 615b.

To further increase energy generation, n additional cells 602n can be added to chemical energy converter 600. Each of the additional cells is comprised of n second catalyst layers 605n and n porous semiconductor or dielectric layers 615n, with a three-dimensional intertwined region 610n formed at every interface between catalyst layers 605n and porous semiconductor or dielectric layer 615n. A three-dimensional intertwined region 612a-612m will be formed between each cell. Such multi-cell structures significantly increase the total catalyst conductor-semiconductor interfacial areas for reaction sites power generation/conversion without including a larger device, thereby increasing fuel conversion via chemical reactions and the corresponding electrical output.

Figure 7:
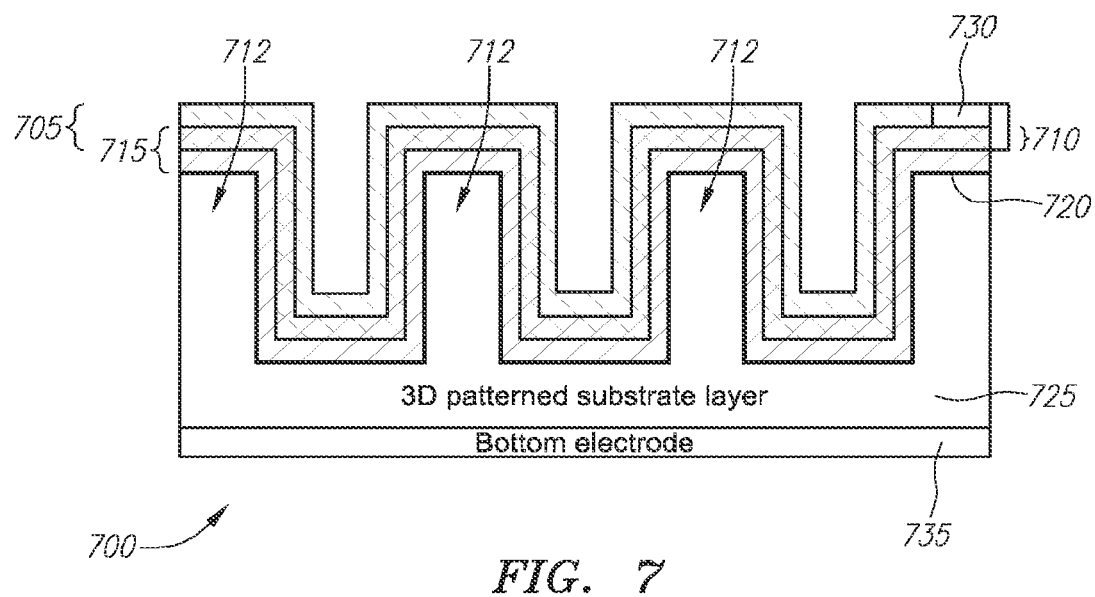
FIG. 7 shows an exemplary energy converter having a patterned three-dimensional network of porous conductor and/or catalyst which can be a conducting catalyst and porous semiconductor or dielectric on a three-dimensional substrates, in which the internal and external surfaces are covered with a porous semiconductor or dielectric layer/network that intertwines with a porous conductor and/or catalyst which can be a conducting catalyst layer/network three-dimensionally. An optional non-porous layer can also be inserted between the three-dimensional substrates and the three-dimensional porous semiconductor or dielectric layer/network.

Yet another embodiment illustrated in FIG. 7, in which an energy converter 700 has the integration of porous catalyst and porous semiconductor described in FIG. 5 constructed on a three-dimensional surface. Such a three-dimensional surface has surface area larger than a planar two-dimensional substrate, which results in increased active sites for power generation/conversion, which in turn increases the amount of electricity generated. In particular, the embodiment described with reference to FIG. 7 has a bottom electrode 735. A three-dimensional substrate 725 is fabricated thereon using, for example, a standard lithography patterning/etching process. In this embodiment substrate 725 forms a patterned three-dimensional network microtrenches 712. If desired, a non-porous layer 720 can be placed over the patterned substrate 725, which acts as a barrier layer between the substrate below and the porous materials above. As in the embodiment shown in FIG. 5, a porous semiconductor/dielectric network 715 is placed over patterned substrate 725 (or non-porous layer 720, if present). A catalyst layer 705 is placed over the porous semiconductor/dielectric network 715, which also enters the pores of the porous semiconductor/dielectric network 715 to form an interwining region 710. A second electrode 730 is placed above a catalyst layer 725, and in combination with first electrode 735, allows a voltage to appear, and hence allows for the use of the electricity generated by the converter device 700.

Figure 8:
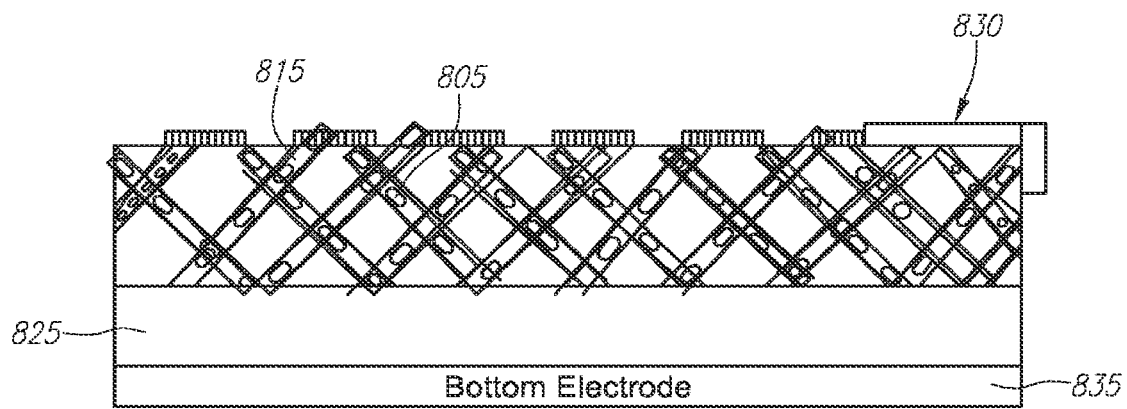
FIG. 8 shows an exemplary energy converter having three-dimensional porous substrate/supporting layer (partially or fully) network of porous conductor and/or catalyst which can be a conducting catalyst and porous semiconductor or dielectric on a three-dimensional substrates, in which the internal and external surfaces are covered with a porous semiconductor or dielectric layer/network that intertwines with a porous conductor and/or catalyst which can be a conducting catalyst layer/network three-dimensionally. An optional non-porous layer can also be inserted between the three-dimensional substrates and the three-dimensional porous semiconductor or dielectric layer/network.

FIG. 8 shows an embodiment of a chemical energy converter 800 comprising a porous three-dimensional substrate/supporting layer 825 where internal and external surfaces are covered with the integration of a porous semiconductor or dielectric layer 815 and a porous catalyst 805 similar to that described in FIG. 5. In particular, chemical energy converter device 800 has a bottom electrode 835, upon which a porous substrate/supporting layer 825 is placed thereon.

A second electrode 830 is placed above layer 825, and in combination with first electrode 835, allows a voltage to appear, and hence allows for the use of the electricity generated by the converter device 800.

Three-dimensional porous substrate is typically amorphous, which, upon annealing can crystallize. Nano-engineered structures typically consist of interconnected walls and wires forming a highly porous structure. The size of the pores, the thickness of the porous layer, among other physical and electrical properties, can be tuned by the processing parameters.

Another method to create a nano-engineered porous network or layer of semiconductor or dielectric, for example $TiO_2$, as a support to the catalyst above it, is to utilize a paste of $TiO_2$ nano-particles to form thin films of porous layers/networks.

Figure 9A:
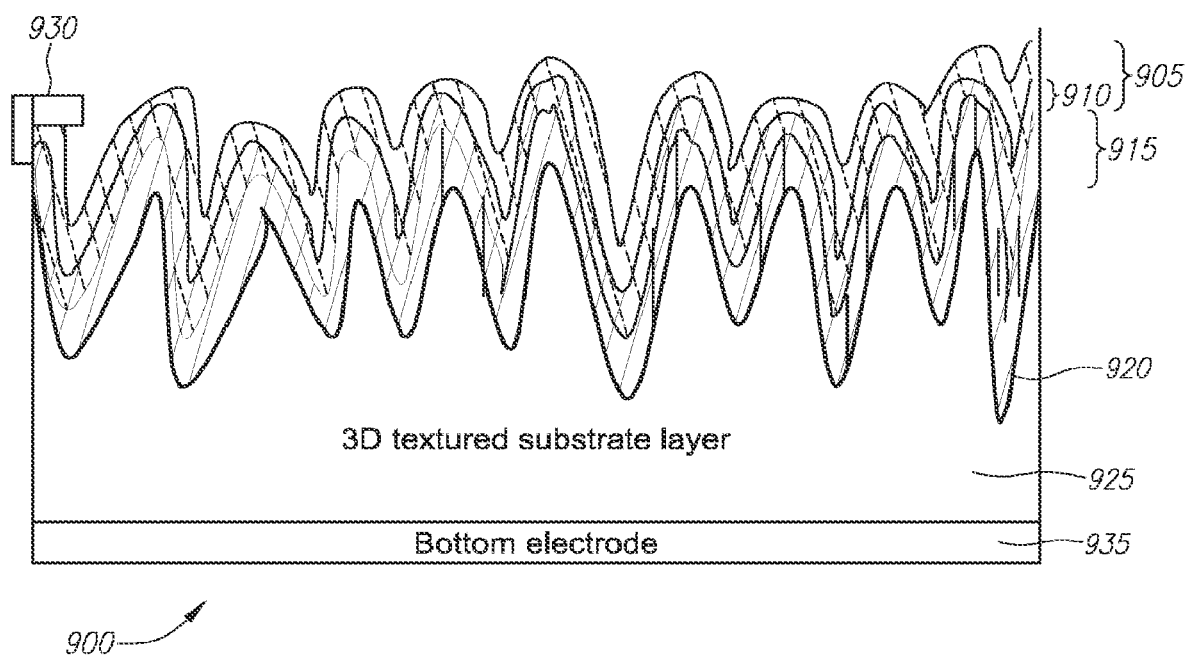
FIG. 9a shows an exemplary energy converter having a textured three-dimensional network of porous conductor and/or catalyst which can be a conducting catalyst and porous semiconductor or dielectric on a three-dimensional substrates, in which the internal and external surfaces are covered with a porous semiconductor or dielectric layer/network that intertwines with a porous conductor and/or catalyst which can be a conducting catalyst layer/network three-dimensionally. An optional non-porous layer can also be inserted between the three-dimensional substrates and the three-dimensional porous semiconductor or dielectric layer/network.

FIG. 9a shows an embodiment having a three-dimensional textured substrate/supporting layer 925 where the surface is covered with the integration of porous semiconductor or dielectric material layer 915 and porous catalyst 905 like the embodiment described in FIG. 5. In particular, the chemical energy converter 900 illustrated in FIG. 9 has a bottom electrode 935. Placed thereon is a three-dimensional textured substrate 925, which for example can be created by etching a silicon wafer.

Textured substrate 925 forms peaks and valleys, thereby creating a three-dimensional reaction area. This three-dimensional reaction area increases the surface area available for chemical reactions, which increases the number of reactive sites that can take place during a particular amount of time for a given device size, thereby increasing the electrical generation capability of the energy converter 900. If desired, a non-porous layer 920 can be placed over the textured substrate 925. As above, the non-porous layer 920 provides a barrier layer to separate the substrate below and the porous materials above. A porous or semiconductor or dielectric layer 915 is placed over the textured substrate 925 (or non-porous layer, if present).

A catalyst layer 905 is placed over the porous semiconductor/dielectric network 915, which also enters the pores of the porous semiconductor/dielectric network 915 to form an interwining region 910. A second electrode 930 is placed above a catalyst layer 905, and in combination with first electrode 935, allows a voltage to appear, and hence allows for the use of the electricity generated by the converter device 900.

As in the other embodiments described herein, the use of a textured substrate 925 results in an increased surface area for catalysis, which results in greater electricity generation than an energy converter having a planar two-dimensional substrate.

Figure 9B:
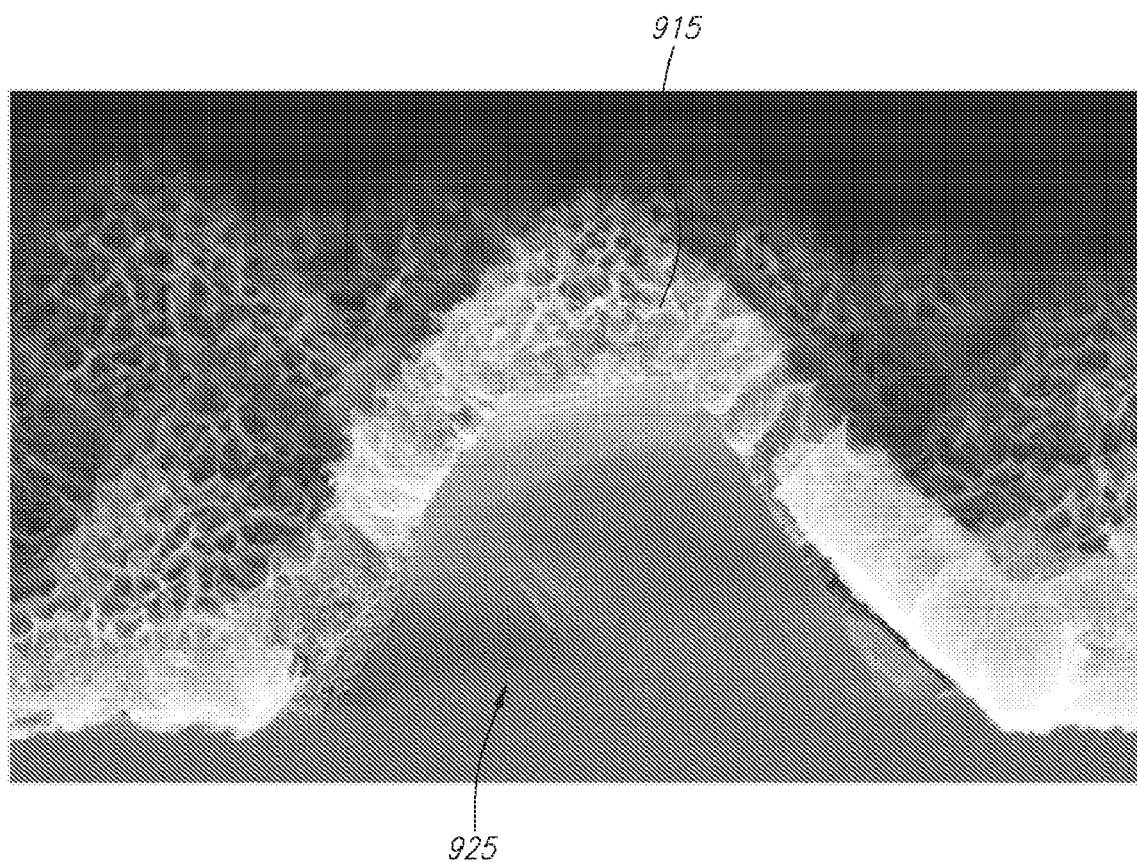
Figure 9C:
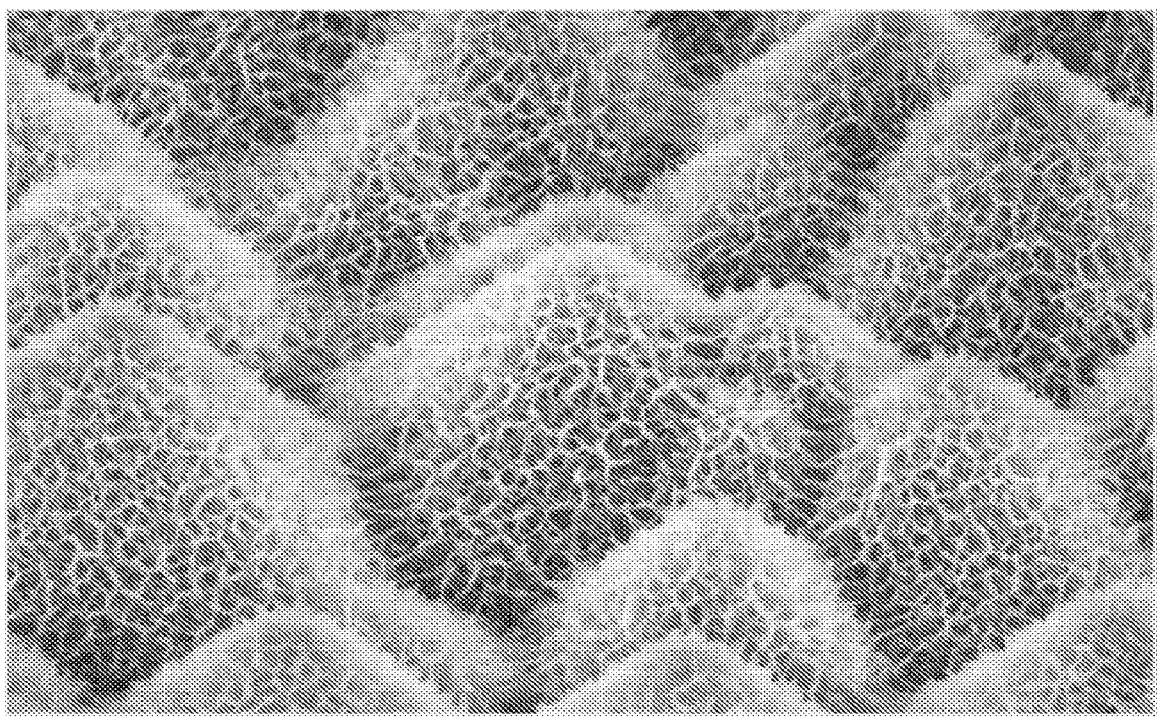

FIG. 9b is a microscopic image depicting an energy converter as in FIG. 9a having a textured substrate. The microscopic image shows substrate 925 having a semiconductor or dielectric layer 915 formed thereon. Catalyst layer 905 (not shown) in the form of nano-particles is over the dielectric/semiconductor layer 915, and nano-particles enter the pores of layer 915 to form an intertwining region. FIG. 9c shows a top view, where one can see the texture of the dielectric/semiconductor layer 915.

Device structures, and methods/processes to fabricate them, using nanowire arrays, nano-engineered structures, to form porous networks comprising solid-state junctions specifically to generate electrical energy are described herein. The device structures can be fabricated on a two-dimensional planar substrate or on a three-dimensional substrate. The two-dimensional or three-dimensional substrates can be rigid or flexible/foldable. An exemplary method comprises fabricating one or more solid-state electric generators. The solid-state electric generators include one or more chosen from the group including a photovoltaically energized solid-state electric generator.

One embodiment is a solid-state device, where the junction providing an electrical retarding potential between the conductor and semiconductor materials may include at least a conductor-dielectric, dielectric-dielectric, or a dielectric-conductor-dielectric junction. Insulators and semimetals are considered subsets of dielectrics and metals here. The term "semiconductor junction" includes semiconductor junctions including quantum wells formed of metal and/or semiconductor, insulator materials with a large bandgap and low doped and amorphous materials, semimetal, insulator, amorphous material, polycrystalline material. The term "metal" includes heavily doped semiconductors, metal, semimetal, heavily doped semiconductor, electrical conductor. The guiding principal is that the junction presents both a retarding and surmountable and/or tunneling potential to the approaching charge carrier.

Figure 10:
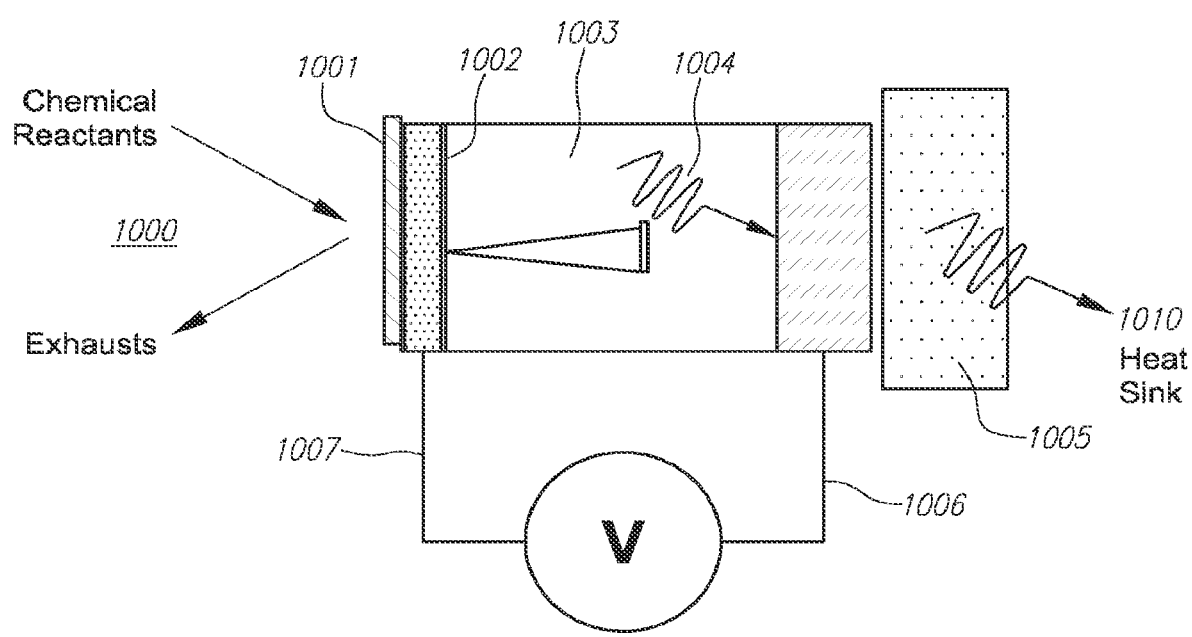
FIG. 10 shows and exemplary energy converter connected to a heat sink.

In one embodiment, the solid-state converter may be connected to a heat sink to dissipate any excess heat from the energy conversion process as shown in FIG. 10. A heat sink can be provided by the reactants and gasses and or by the substrate, which can be physically connected to a heat sink. Referring to FIG. 10, chemical reactants in a region bounded in part by a surface 1001 containing a catalyst may react in the vicinity of the surface, may contact, adsorb, dissociate, recombine, or form reaction intermediates on, near or in the vicinity of the surface 1001.

The dielectric and electric potential barrier material 1003 in the embodiment of FIG. 10 is chosen to be semiconductor $TiO_2$, compared to the conductor. Conductor 1002 forms the Schottky barrier with the dielectric semiconductor 1003. Electric potential is observed between negative electrode 1006 and positive electrode 1007. Both conductor and electrode materials include materials chosen from the group including at least a conductor such as a metal, a conducting oxide, and degeneratively and heavily doped semiconductors such as heavily doped silicon, and semiconductors, materials with a high ZT figure of merit. Heat generated by the reactions and by the Schottky junction energy converter is rejected into a colder temperature heat sink 1005.

The lower temperature heat sink in FIG. 10 may comprise the reactants 1000 themselves, because the reactants in this device are generally not hot when supplied to the system. One embodiment includes using dielectric or semiconductor 1003 other than $TiO_2$ including but not limited to, for example, rutile $TiO_2$, anatase $TiO_2$, porous anatase $TiO_2$, $SrTiO_3$, $BaTiO_3$, $Sr_{-x}$-$Ba_{-y}$-$TiO_{-z}$, LiNiO, and $LaSrVO_3$, and certain organic semiconductors, such as PTCDA, and 3,4,9,10-perylenetetracarboxylicacid-dianhydride. The subscripts x,y and z denote concentrations, per usual conventions. One advantage of SrTiO.sub.3 is that Schottky barriers on it may be unpinned, providing a relatively larger barrier compared to that of $TiO_2$.

One embodiment of FIG. 10, a heat sink 1005 can be directly coupled to the dielectric 1003, whereas in other embodiments, direct coupling is not required. Such heat sinks can include but are not limited to heat pipes, capillary systems with fluid flow, evaporative cooling including but not limited to using reactants themselves, heat conductive materials and convective flow methods, and a nanoscopic thermal gradient converter.

In one embodiment, the energy converter system may comprise a primary converter connected to a number of secondary converters connected to a heat sink as shown in FIG. 11. The primary converter may be chemically energized. The primary converter may be energized by one energy source while the secondary converters may be energized by another energizing source. Alternately, they may be energized by a similar energizing source. For example, the primary converter may be energized by chemical reactions, and the excess heat from the primary energy converter in turn energizes the secondary converter. In a configuration including other primary energy conversion systems in general, solid-state converters are connected in series thermally, and in series or in parallel, electrically. This interconnection referred to as "series-parallel" does not preclude series parallel configurations used to assure reliability. For example, the negative electrode 1108 of the chemically energized generator is electrically and thermally coupled to the positive electrode of secondary converter 1101. The negative electrode 1103 and semiconductor material 1102 of secondary converter are coupled thermally to the colder, heat sink 1110. Electricity is taken from the positive electrode of 1106 and the negative electrode 1103, and because the devices are in series for this example, also from positive electrode of 1101 and negative electrode 1103. Note the output voltage may be tapped from any of the positive and negative electrode pairs. Note that such multiple outputs are highly advantageous.

This configuration permits the chemically energized generator to operate at a higher temperature than without the secondary converter, permitting an increase in reaction rates and therefore higher power density. The increased temperature also permits use of a wider range of reactants and operation at the ignition temperature of some reactants.

Referring to FIG. 12, one embodiment recursively repeats thermally energized solid-state converters, each connected in series to the next both electrically and thermally. The first stage 1201 can be a chemically energized an electric generator energized by any of the many known methods.

The recursively repeated solid-state converters 1202 then generate electricity from the higher temperature 'reject heat' of the first stage 1201 and the lower temperature ambient heat sink. Estimates suggest that a recursively repeated thermal gradient converter can achieve approximately 80% of the Carnot limit efficiency between its heat source and heat sink temperatures.

An output voltage may be tapped from any of the positive and negative electrode pairs. One embodiment uses a primary energy converter attached to a series of secondary thermal gradient converters attached to a heat sink. FIG. 12 shows such an energy converter. A number of secondary converters 1202 are connected in series. One end of the series 1202 is attached to a heat sink 1203. The other end of the series 1202 is connected to a primary energy converter 1201. The primary energy converter may be chemically energized by thermal gradients, photovoltaic or other means. The number of components 1202 may be from zero (0) to a desired number, both inclusive. The main function of the components of 1202 is to convert a fraction of the reject heat energy from the previously connected energy conversion component to an electrical potential.

An embodiment can include a primary converter 1201, attached to a series of secondary converters 1202, one or more of which may include a dielectric-conductor-dielectric junction and connected in series electrically and thermally and attached to a heat sink.

Figure 13:
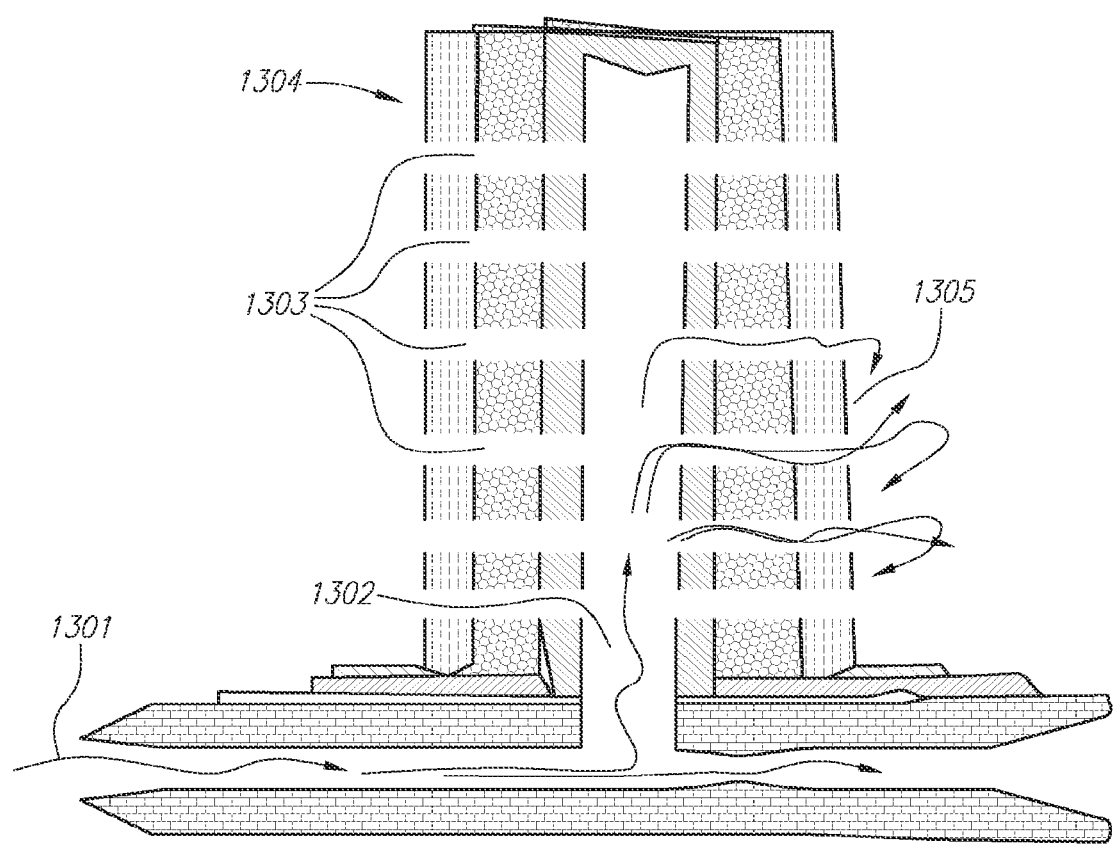
FIG. 13 illustrates an exemplary cross section showing reactant and coolant flow from coldest (inside of structure) to hottest (outside of structure) on which pre-equilibrium ballistic refraction converter assemblies are affixed.

Various embodiments provide a heat sink for the solid-state energy converters. A heat sink for cooling can be achieved in many ways, including by convective flow, phase change or evaporative cooling, and heat pipes. Reactants or reactant components may be used. For example, FIG. 13 illustrates an embodiment using pores/holes 1303 with the structure supporting the converters and with the interior of the converter assembly, through which coolant may flow, reactants may flow, additives may flow, or any combination of these materials may flow. Not shown, but also usable for this feature, are channels, ducts or pipes instead of pores/ holes 1303. Each case has its advantages. Materials 1301 flow from the colder side 1302, through pores or holes 1303 to the hot region 1304. Both the cold side 1302 and the hot side 1304 may include reactants or additives, and the hot side is associated with both exhausts and airflow.

Evaporation of reactants 1301 on the cold side 1302 as well as the flow of colder materials 1301 causes cooling. Reactants 1301 can be concentrated and fuel rich near the stack hot surface 1305.

Using liquid reactants or evaporative coolant 1301 that becomes gas upon contact with warmer, reaction surface 1305 provides desirable gas specie for chemically energized hot electron processes.

One embodiment forms converters directly on aerodynamic surfaces. This permits both direct generation of electricity as well as using the gas generated by the liquid-gas transformation as mass flow to push a turbine or other mechanical extraction of useful work and generation of shaft energy.

One embodiment uses liquid air and other liquid gasses 1301 for their low temperature heat sink in an electric generator. Liquid air and similar inert liquid gasses may provide a heat sink to the region 1302, the ambient air in the exhaust region 1304 may provide the heat source, and the device may thereby generate electricity directly using the temperature difference. The liquid/gas phase transition may also operate a mechanical energy converter such as a turbine, at the same time.

One embodiment uses natural convection to provide airflow. It is noted that the cooling air volume can typically be orders of magnitude greater than the reaction air volume.

One embodiment based on FIG. 13 may also represent the cross section of generalized tube geometry, such as flattened tubes. A generalized tube is coated on one or more faces with solid-state energy converters. "Tube" here refers to something with any partly hollow geometry, with any relative wall thickness, including non-uniform walls. For example, a tube can be flattened so that it looks like two sheets with an enclosed space between them to allow gas or fluid flow and with the volume enclosed at the edges.

Referring to FIG. 14, an elementary stackable unit is placed on a structure that includes one or more of the electrically conducting layer, thermally conducting layer, and the structural support layer.

Embodiments connect and stack together more than one or more solid-state generator assembly to create a volume of electric generators. The stacks can be connected electrically in series or parallel.

One embodiment of an elementary stackable unit, shown in cross section in FIG. 14, includes the key element: solid-state converter 1401 (which may comprise of primary only or primary and secondary energy converters) to be connected electrically with positive and energized side 1404 up and negative side down. The energy converters are supported and connected with positive electrode connection 1402, negative electrode connection 1403. Structure 1403, which may include one or more of an electrically conducting element, a thermally conducting element and a strength structure element. Stacking involves placing the elementary stackable unit on top of other elementary stackable units, leaving a space above the active area of the converter 1401 for energizing and heat sources. The same may be accomplished in any workable configuration or arrangement.

Figure 15:
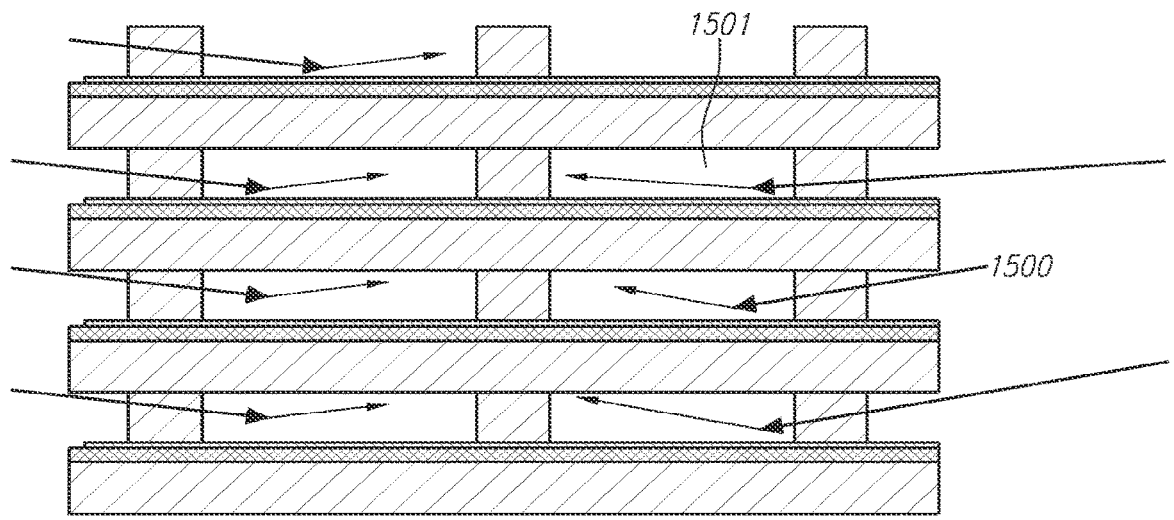
FIG. 15 illustrates an exemplary cross section showing stacking of substrates containing solid-state energy converter assemblies and showing reactant, cooling and exhausts flows in the spaces between stacked elements.

The embodiment shown in FIGS. 14-A and 14-B connects the positive electrodes 1402, 1404 to the negative electrode 1403, through the converter 1401. While positive electrodes 1402 and 1403 are shown, only one need be present. A cross section of this is shown in FIG. 15. Note that each elemental structure of FIG. 15 may be recursively stacked in the vertical and/or in the horizontal direction to form a matrix of the three-dimensional elemental stacked structures.

FIG. 14-B provides detail related to electrical and thermal connections and interfaces that have been deliberately left out for clarity in the embodiments.

In practice, those generally skilled in the art would use one of many known methods to connect the electrode to the converter. Referring to FIG. 14-B, one embodiment places the positive electrode 1402 on an insulator 1405 formed directly on the structure 1403 and then an electrical bridge 1406 is formed to electrically connect the positive electrode 1402 to the positive end and active surface 1404 of the converter assembly. The structure element 1403 would in practice include an electrical conductor connected to the negative side of the converter and would also include a thermal connection to the converter. A simple embodiment forms the structure 1403 to be both electrically and thermally conducting, for example a 5 micron thick aluminum or copper foil.

One embodiment stacks the elementary stackable units shown in FIGS. 14-A and 14-B on top of each other, forming a volume of electric generator energy converters. Reactants and coolants 1500 flow into the spaces 1501 between the stacks and exhausts flow out through the spaces.

Figure 16:
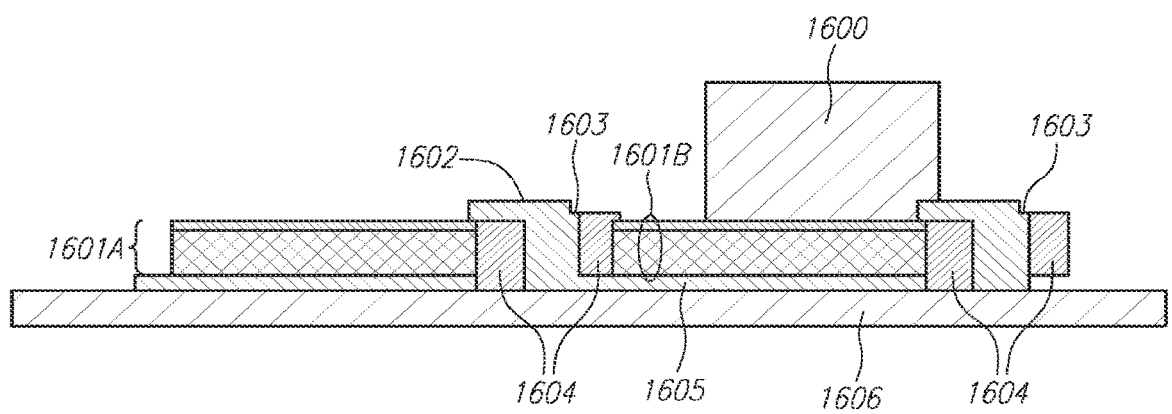
FIG. 16 illustrates an exemplary cross section showing solid-state energy converter assemblies connected electrically in series across the surface of a supporting structure.

Another embodiment connects the converters in series along the plane of the stack by connecting the positive electrode to the negative electrode of adjacent converters in the same plane. This can be accomplished several ways, one of which is shown in FIG. 16. An electrical connection 1602 is made to the positive side and active surface of a first converter 1601A and is connected to an interconnecting conductor 1603 isolated by insulators 1604. The interconnect 1603 electrically contacts the negative side 1605 of a second converter 1601A. The insulating spacer 1600 is shown conceptually behind a converter in FIG. 16. The two series devices sit on substrate 1606.

Figure 17:
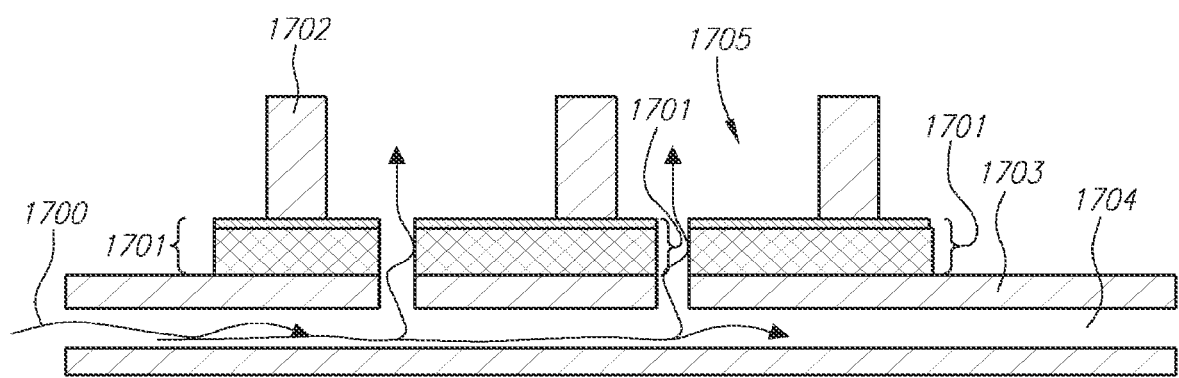
FIG. 17 illustrates an exemplary cross section showing a substrate with reactant and coolants flowing through a supporting structure and around solid-state energy converter assemblies on the structure.
Figure 18:
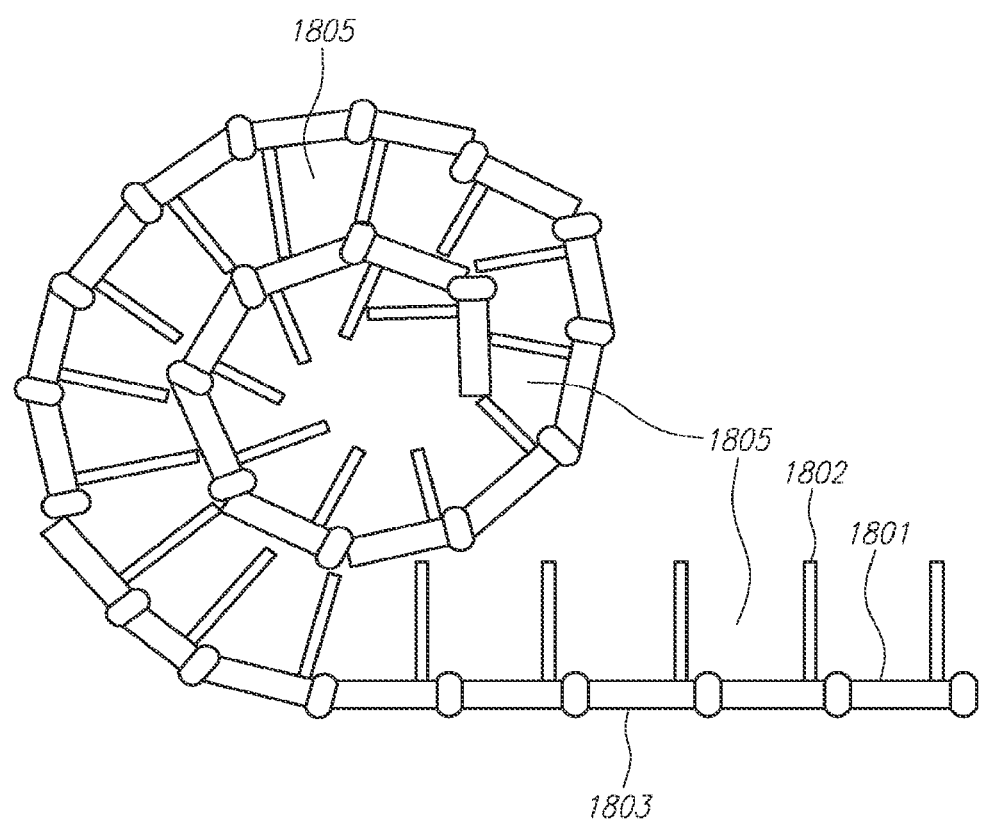
FIG. 18 illustrates an exemplary surface containing solid-state energy converters and spacers being rolled, permitting reactant and coolant flow through the roll.

Another embodiment provides coolants and/or reactants 1700 through the body of an elementary stackable unit is shown in FIG. 17. For example, solid-state converters 1701 and spacers 1702 are formed on a structure and substrate 1703 inside of which 1704 flow reactants and/or coolants 1700. Referring to FIG. 18, the device of this embodiment can be rolled up and the spaces 1705 (numbered as 1805 in FIG. 18) between the roll formed by spacers 1702 (numbered as 1802 in FIG. 18) and converters 1701 (numbered as 1801 in FIG. 18) permit reactants to flow into and exhausts can flow out of the spaces 1805. The spacers 1702/1802 and electrical interconnects are also shown in FIG. 17 for clarity. Detailed connections could also be like those explained in FIG. 16 and FIG. 14-B.

In each of these embodiments, the converters can take on many forms, including the pillar forms described above, and can be attached on many surfaces of nearly arbitrary shapes.

Figure 19:
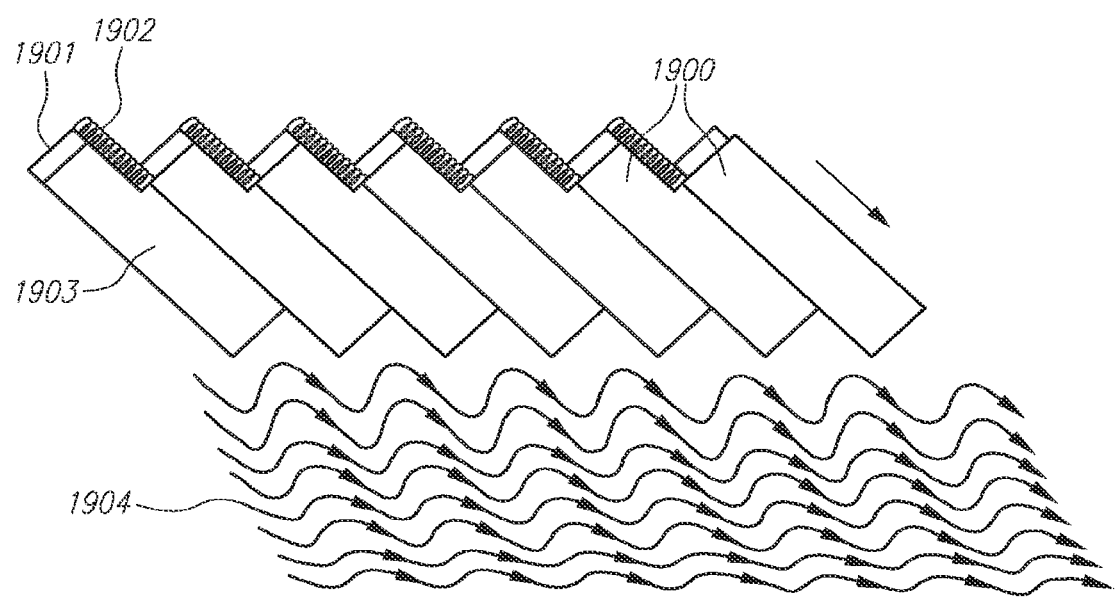
FIG. 19 shows a cross-section of an exemplary embodiment of a device for converting the energy released by a catalytic reaction into mechanical work.

FIG. 19 shows an exemplary embodiment of a device in which the emissions of phonons generated by adsorbing and bonding reactions on or within catalyst surfaces, clusters or nano-structures are converted into hydraulic fluid pressure.

In accordance with the embodiment shown in FIG. 19, pressures generated by phonons directed into a catalyst body on a first side of the catalyst body form a phonon wave which can be guided by the geometry of the catalyst (or substrate upon which the catalyst may be situated) so that the phonons travel to the other side of the substrate and impart a pressure onto a fluid. The thickness of this travel should be less than the mean distance over which the direction of the phonon remains substantially unperturbed. The phonons arrive at an angle (a "grazing" angle) such that the directional and asymmetric pressure of the arriving phonons appears as wave motion on the other side of the catalyst body which pushes against a fluid such as a liquid metal or sacrificial interface, causing it to move in a direction parallel to the bottom surface. An apparent negative coefficient of friction between the wall and the fluid is exhibited due to the wave motion or directed impulses along the surface of the bottom of the device.

The exemplary device comprises a substrate 1902 with top and bottom surfaces having a saw-tooth pattern, as shown in the cross-sectional view of FIG. 19. The bottom surface is in contact with a hydraulic fluid 1904. As shown in FIG. 19, the substrate can be thought of as comprising a plurality of sub-structures 1900 having rectangular cross-sections and arranged adjacent to each other at an angle with respect to the hydraulic fluid 1904.

At the top surface of the substrate, each sub-structure 1900 includes a layer 1901 comprising a catalyst. On an exposed side surface between adjacent sub-structures, each sub-structure 1900 includes a layer 1902 of material which is inert with respect to the catalyst and the reactants. The body of each sub-structure is comprised of a substrate 1903, which also acts as a phonon waveguide. Platinum can be used for the catalyst layer 1901 and for the substrate 1903 with air as the oxidizer, ethanol or methanol as the hydrocarbon reactant fuel and water or mercury as the hydraulic fluid 1904. The hydraulic fluid can also serve as a coolant for the device, thereby permitting high power density operation.

The catalyst 1901 and substrate 1903 may be comprised of the same material, e.g., platinum. Other substrate materials may be used based on structural considerations, manufacturability and/or impedance matching so as to maximize the propagation of the phonon motion into the hydraulic fluid.

The thickness of the platinum catalyst layer 1901 and substrate 1903 should be less than the energy-changing mean free path of optical branch phonons or high frequency acoustic branch phonons, which is at least of order 10 nanometers and can be as large as one micron.

Nanofabrication methods can be used to form the saw-tooth patterns on the surfaces of the substrate 1902, with the dimension of a unit of such pattern being as large as 1 micron.

By depositing the inert layers 1902 as shown, e.g., on the right-facing facets of the saw-tooth pattern of the top surface, a preferential direction is thereby established for reactions and thus for phonon propagation, as indicated by the arrow in FIG. 19.

Acoustic, ultrasonic or gigahertz acoustic Rayleigh waves on the catalyst side can be used to stimulate the reaction rate and synchronize the emission of phonons. The waves increase the magnitude of the phonon emission and cause coherent emission, greatly enhancing both the peak and average power.

In a further embodiment, a thin layer or layers of material are arranged between the substrate and the fluid. These layers are comprised of materials having acoustic impedances between that of the substrate 1902 and the hydraulic fluid 1904, so as to maximize the transmission of momentum into the hydraulic fluid and minimize reflections back into the substrate 1904. The material should be selected so that the bulk modulus and phonon propagation properties of the material cause the phonons emerging from the substrate to be transmitted substantially into the fluid with minimal reflection and energy loss.

To enhance catalytic reactions, the catalyst and the substrate structure can take the 3-D porous forms described in FIGS. 4 through 9. This increases the reaction area and the reactions rate to provide increase in the magnitude of the generated phonons. This increases the motion generated per unit projected area.

In a further embodiment of a device, the emissions of phonons generated by catalytic reactions are converted into electrical current by piezo-electric effects within materials as the phonons impact the materials. An exemplary embodiment of such a device is shown in FIG. 20.

Figure 20:
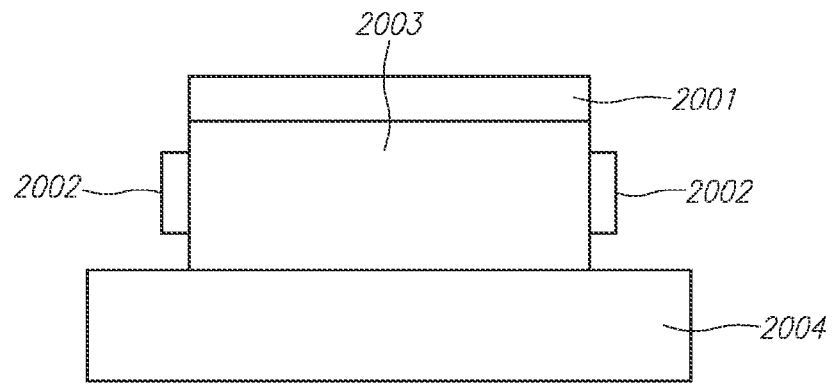
FIG. 20 shows a cross-section of an exemplary embodiment of a device for generating electricity piezoelectrically.

The exemplary device of FIG. 20 comprises a catalyst layer 2001 arranged on a piezo-electric element 2003, which is in turn arranged on a supporting substrate 2004. The layers 2001, 2003 can be three-dimensional porous structures as described herein as solid-state devices, sitting on a 2-D or 3-D textured substrate, which be rigid, flexible or foldable. The catalyst layer 2001 can be implemented as a nanocluster, nanolayer or quantum well, or 3-D porous network. Electrical leads 2002 are provided at opposite ends of the piezo-electric element 2003 across which a potential is developed, in accordance with the present invention. In the exemplary embodiment of FIG. 20, the catalyst layer 2001 comprises platinum, with air as the oxidizer and ethanol or methanol as the hydrocarbon reactant fuel. The piezo-electric element 2003 can comprise any piezomaterial, including semiconductors that are not normally piezoelectric, such as InGaAsSb. The lattice mismatch between the semiconductor and the platinum produces a strain, commonly called a deformation potential which induces piezo-electric properties in semiconductors, or ferroelectric or piezoelectric materials with a high nonlinearity such as (Ba, Sr)TiO3 thin films, AlxGa1-xAs/GaAs and strained layer InGaAs/GaAs (111)B quantum well p-i-n structures.

Where the piezoelectric element 2003 is comprised of a semiconductor, the semiconductor becomes a diode element that converts photons into electricity, collects electrons as electricity, and converts phonons into electricity.

In the exemplary embodiment of FIG. 20, as the reactants interact with the catalytic layer 2001, phonons generated by the reactions are conducted into the piezoelectric material 2003. As a result, a potential is induced in the piezoelectric material 2003 at the electrical contacts 2002.

The geometry of the substrate 2003 is preferably such as to focus phonons so as to enhance the nonlinearity of the piezoelectric element 2003. This results in self-rectification of the high frequency phonons. In an exemplary embodiment, the piezoelectric element 2003 is preferably curved and shaped like a lens or concentrating reflector so as to focus the phonons generated by the catalyst on to the piezoelectric material. The focusing of the phonons causes large amplitude atomic motions at the focus. The atomic motions induced by this focusing cause the piezoelectric material to become nonlinear, causing non-linear responses such as the generation of electricity in the material at the focus. This in turn results in the piezo-material becoming a rectifier of the phonon-induced high frequency current.

Acoustic, ultrasonic or gigahertz acoustic Rayleigh waves can be used on the catalyst side of the exemplary device of FIG. 20 to stimulate the reaction rate and synchronize the emission of phonons, to enhance the magnitude of the phonon emission and to cause coherent emission, greatly enhancing both the peak and average power delivered to the piezoelectric material 2003. Acoustic Rayleigh waves accelerate oxidation reactions on platinum catalyst surfaces. Surface acoustic waves can be generated on the surface of the catalyst 2001 using a generator (not shown). Such waves may have acoustic, ultrasonic or gigahertz frequencies. The Rayleigh waves induce reactions so as to synchronize the reactions, which in turn synchronizes the emission of phonons. The result is a pulsing bunching of the reactions, which enhances the power delivered to the piezoelectric material 2003.

The frequency of operation of the device of FIG. 20 is preferably in the GHz range and lower so that rectification of the alternating currents produced by the piezoelectric material 2003 can be achieved with conventional means, such as with semiconductor diodes.

Figure 21:
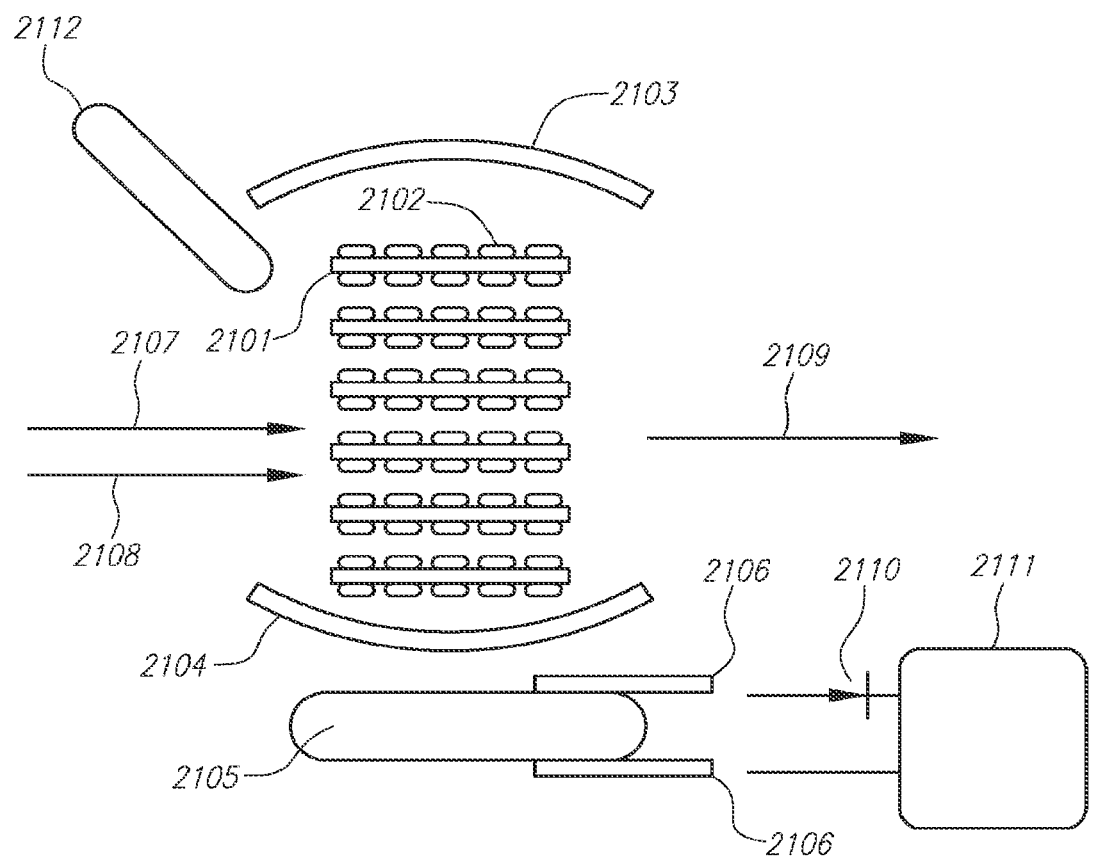
FIG. 21 shows an exemplary embodiment of an arrangement for generating electricity or radiation beams in accordance with the present invention.

In a further exemplary embodiment, electromagnetic radiation, such as infrared photons emitted by excited state products such as highly vibrationally excited radicals and final product molecules, is converted into electricity photovoltaically. Stimulated emission of radiation is used to extract the energy from the excited state products, such as highly vibrationally excited radical and reaction product molecules both on the catalyst surface and desorbing from it. The extracted energy appears in the form of a coherent beam or a super-radiant beam of infra-red or optical energy. The frequencies of the radiation correspond to fundamental (vibration quantum number change of 1) or overtones (vibration quantum number change 2 or greater) of the normal mode vibration frequencies of the reactants. Several different frequencies may be extracted simultaneously in this invention. While the resulting coherent beam is useful in its own right, this high intensity beam can also be photovoltaically converted into electricity. In accordance with the present invention, such emissions are created by reactions on catalyst surfaces, and are accelerated by the use of optical cavities. FIG. 21 shows an exemplary embodiment of an electric generator for performing such a conversion.

The device of FIG. 21 comprises one or more substrates 2101 (for clarity, only one of which is numbered) upon which a catalyst 2102 (for clarity, only one of which is numbered) is arranged in a plurality of islands, nanoclusters, quantum well clusters or quantum dots. The catalyst clusters are sufficiently spaced apart (e.g., tens of nanometers or more) and the substrate is made sufficiently thin (e.g., less than a centimeter total optical thickness), so that IR absorbtion is mitigated at the frequencies of specie emission. The assembly of catalyst clusters on the substrates 2101 is substantially transparent to the reaction radiations. The catalyst 2102 is preferably platinum or palladium. The device preferably comprises a plurality of substrates 2101 stacked so as to permit a volume of reactions. Again, in addition, to enhance catalytic reactions, the catalyst/substrate structures can be of any forms described previously in FIGS. 4-9.

The catalyst-substrate stack 2101/2102 is enclosed in an optical cavity having a highly reflective element 2103 and a less reflective element 2104 arranged as shown in FIG. 4. The optical cavity and the catalyst-substrate stack 2101/2102 are preferably resonant to the reaction radiations or their overtones. The optical cavity can be used to stimulate overtone radiation, i.e., multipole radiation where the change in quantum number is 2 or more, to increase the energy of the radiation. The optical cavity preferably has multiple frequencies, as in a Fabrey-Perot cavity, that are tuned to overtones of the specie frequencies.

A fuel 2107, such as hydrogen, ethanol or methanol and an oxidizer 2108, such as air, are introduced into the optical cavity where they interact with the catalyst-substrate stack 2101/2102. Lean mixtures of fuel can be used so as to minimize resonant transfer, exchange or decay of excited state vibrational energy to other specie of the same chemical makeup in the exhaust stream, during the time these species are in the optical cavity and the photovoltaic converter 2105 collects the radiation and converts it into electricity. Exhaust path 1209 follows.

A stimulated emission initiator and synchronizer device 2112 is used to initiate and synchronize the emissions in the optical cavity. The device 2112 can be a commonly available stimulated emission oscillator and can be coupled to the device of the present invention in known ways. The optical cavity can be designed in a known way to create stimulated emission of radiation. A photovoltaic cell is typically not very efficient in converting long wavelength IR photons (1000 to 5000 per centimeter) characteristic of the catalytic reactions. The high peak power output of the device 2112 remedies this situation and makes the IR photovoltaic cell more efficient.

A photovoltaic converter 2105 is placed outside the volume of the catalyst-substrate stack 2101/2102 anywhere visible to the emitted radiation. Such a placement allows cooling the photovoltaic collector 2105 using known methods. The electrical output leads 2106 of the photovoltaic collector 2105 can be coupled to an electrical energy storage device 2111 via a diode 410. The output of the photovoltaic converter 2105 is in pulses with the pulse rate typically being greater than one megahertz. The electrical energy storage device 2111 may comprise, for example, a capacitor, super-capacitor or battery. Given the high frequency of the pulsed output, a capacitor used as the storage device 2111 can be quite compact. The capacitor need only be large enough to collect the energy of a single pulse. The energy stored in the capacitor can thus be millions of times less than the energy delivered by the converter 2105 in one second.

The chemical reactants on the catalyst surface permit overtone transitions because they are part of a "ladder" of transitions and strongly polarized on the catalyst surface, which permits all the transitions to have non-zero dipole radiation transition matrix elements. Also, the reactants have no rotational smearing associated with free molecules in a gas because they are attached to the surface and can not rotate. These features permit a near monochromatic overtone light amplification by stimulated emission of radiation.

The electromagnetic energy radiated by the stimulation of species, as in the embodiment of FIG. 21, can be formed into high brightness, quasi-monochromatic, poly-chromatic radiations or coherent beams.

In each of the above described embodiments which include photovoltaic semiconductors, the catalyst is preferably operated at a high surface power density, e.g., in excess of 10 watts per square centimeter or with a peak surface power density of at least one watt per square centimeter, to enhance the efficiency of the photovoltaic semiconductors.

The present methods, devices and systems improve the energy conversion efficiency of junctions used in solid-state devices to generate electricity. An energy source injects charge carriers, e.g. electrons, on one side of a junction. When a net excess of charge carriers is injected from one side of a junction to the other, it will be forced to travel in the external circuit by the electric field. The result is the conversion of chemical energy into the useful form of an electrical energy. An element of the embodiments is that the efficiency of this process is improved when the charge transport or mobility is improved in the semiconducting material.

An alternative mechanism for generating power is creating an electrochemical potential difference between the nanowire network or nano-engineered porous networks/layers and the catalyst which can act as an electromotive force (EMF). The semiconductor/catalyst surface may favor one of the oxidation or reduction reactions, effectively splitting the two reactions. This can create an electrochemical potential gradient between the catalyst site and the semiconductor surface, which can induce an electro-motive force (EMF) in an external circuit and drive a load.

One embodiment includes nanowire array or nano-engineered porous networks/layers made from dielectric or semiconductor including but not limited to, for example, rutile TiO2, anatase TiO2, poly-crystalline TiO2 porous TiO2, ZrO2, SrTiO3, BaTiO3, Sr_x—Ba_y—TiO_z, LiNiO, silicon, Al2O3; ZnO; SiC; GaN; GaAs; Ge; silica; carbon; oxides of niobium, tantalum, zirconium, cerium, tin, vanadium, and LaSrVO3, and certain organic semiconductors, such as PTCDA, or 3,4,9,10-perylenetetracarboxylicaciddianhydride. The subscripts x, y and z denote concentrations, per usual conventions. One advantage of SrTiO3 is that Schottky barriers on it may be unpinned, providing a relatively larger barrier compared to that of TiO2.

Fuels, Oxidizers, Autocatalysts, Stimulators

The various chemical energy converter devices described herein use storable reactants including oxidizers, autocatalytic reaction accelerators, decelerators, and monopropellants. The liquid phase, such as liquid hydrogen peroxide $H_2O_2$ at standard pressure and temperature, are convenient because their heat of vaporization is used as coolant and the liquid is conveniently storable. Monopropellants such as $H_2O_2$ and monomethylhydrazine (MMH) are similarly convenient and energize the active surface of converters. Autocatalytic accelerators include monopropellants such as $H_2O_2$.

One embodiment uses reactions and reactants to energize these excitations. The reactions, reactants and additives include at least monopropellants, high energy fuels with oxidizers, hypergolic mixtures, and additives and combinations of reactants known to produce autocatalytic specie, reactants chosen to accelerate reactions or to control reactions, and combinations thereof. The reactants and/or additives include but are not limited to the following reactants:

Energetic fuels more storable than ammonia:
    amine substituted ammonias
    Di-Methyl-Amine $(CH_3)_2NH$
    Tri-Methyl-Amine $(CH_3)_3N$
    Mono-Ethyl-Amine (C2H5)NH2
    Di-Ethyl-Amine $(C_2H_5)_2NH$)

Other classes more easily storable:
    Methanol, $CH_3OH$
    Ethanol, EtOH CH3CH2OH
    Formic Acid, HCOOH
    diesel fuels
    gasoline
    alcohols
    slurries including solid fuels
    Carbon Suboxide, $C_3O_2$, CO=C=CO,
    Formaldehyde HCHO,
    Paraformaldehyde, =better $HCHO)_n$, sublimeable to Formaldehyde gas. (Potentially a cell coolant at the same time).

Less storable fuels:
    Carbon Monoxide
    Hydrogen
    Ammonia NH3

Energetic fuels containing Nitrogen:
    Nitromethane, $CH_3NO_2$
    Nitromethane "cut" with Methanol=model airplane "glow plug" engine fuel High energy fuels with wide fuel/air ratio:
    Epoxy-Ethane, =Oxirane or Ethylene-Oxide CH2-CH2O
    1,three-Epoxy-Propane=Oxetane and Tri-Methylene-Oxide=1,three-Methylene-Oxide $CH_2$—$(CH_2)$—$CH_2O$
    Epoxy-Propane CH2-(CH2)-CH2O
    Acetylene, $C_2H_2$
    Diacetylene=1,three-Butadiyne
    1,three-Butadiene $CH_2$=CH—CH=$CH_2$, Less exotic high energy fuels:
    Di-Ethyl-Ether or surgical ether
    Acetone=Di-Methyl-Ketone Less exotic, volatile fuels:
    Cyclo-Propane
    Cyclo-Butane
    Hydrocarbons such as methane, propane, butane, pentane, etc.

Other storable fuels:
    Methyl Formate HCOO—$C_2H_5$
    Formamide HCO—$NH_2$
    N,N,-Di-Methyl-Formamide HCO—N—$(CH_3)_2$
    Ethylene-Diamine $H_2N$—$CH_2$—$CH_2$—$NH_2$
    Ethylene-Glycol
    1,4-Dioxane=bimolecular cyclic ether of Ethylene-Glycol
    Paraldehyde $(CH_3CHO)_3$ cyclic trimer of Acetaldehyde Powerful oxidizer:
    Tetra-Nitro-Methane, $C(NO_2)_4$ . . . does not spontaneously decompose . . . just pass the two separate vapors over the reaction surface of the cell in the gas phase
    Hydrogen Peroxide H2O2

Low initiation energy mixtures:
    Cyclo-Propane with Oxygen=surgical anesthetic, microjoules initiator Hypergolics:
    UDMH=Unsymmetrical DiMethyl Hydrazine=1,1-DiMethyl Hydrazine $(CH_3)_2NNH_2$
    UDMH is hypergolic usually with $N_2O_4$ and is a very potent carcinogen
    MMH MonoMethyl Hydrazine $(CH_3)HNNH_2$ hypergolic with any oxidizers, e.g. $N_2O_4$ Corrosive Toxic energetic monopropellant:
    Hydrazine=$H_2NNH_2$ decomposed easily with a catalyst (usually Pt or Pd or Molybdenum Oxide
    Hydrazine Hydrate Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. An energy conversion device for conversion of chemical energy into electricity, comprising:
a first electrode;
a substrate connected to said first electrode;
a porous semiconductor layer disposed over said substrate, said porous semiconductor layer having a nano-engineered structure forming a semiconductor network;
a porous catalyst material on at least a portion of said porous semiconductor layer, the porous catalyst material in contact with a fuel and an oxidizer, wherein at least some of the porous catalyst material enters the nano-engineered structure of the porous semiconductor layer to form an intertwining region, the porous catalyst material and the porous semiconductor layer forming a solid-state junction; and
a second electrode disposed over the porous catalyst material, wherein electrons from the porous catalyst material are ballistically injected into the porous semiconductor layer, wherein an electrical potential is formed between the first electrode and a second electrode during chemical reactions between the fuel and the porous catalyst material, the electrons from the porous catalyst material are attracted to the first electrode, and the electrons travel in an external circuit from the first electrode to the second electrode before returning to the porous catalyst material; and a heat sink that removes heat from the energy conversion device, the heat sink having a heat sink temperature higher than an ambient temperature.

2. The energy conversion device of claim 1, wherein the substrate is patterned to create a three-dimensional surface, thereby providing increased surface area for chemical reactions.

3. The energy conversion device of claim 1, wherein the porous semiconductor layer is patterned such that nanowires are formed.

4. The energy conversion device of claim 1, wherein the substrate is textured such that peaks and valleys are formed.

5. The energy conversion device of claim 1, further comprising a non-porous semiconductor layer in between the substrate and the porous semiconductor layer.

6. The energy conversion device of claim 1, wherein the substrate itself is two-dimensional and planar.

7. The energy conversion device of claim 1, wherein the substrate itself is three-dimensional and possessing internal and external surfaces.

8. The energy conversion device of claim 1, wherein the substrate is rigid.

9. The energy conversion device of claim 1, wherein the substrate is flexible.

10. The energy conversion device of claim 1, wherein the substrate is foldable.

11. The energy conversion device of claim 1, wherein the solid-state junction is a Schottky diode.

12. The energy conversion device of claim 1, wherein the solid-state junction is a p-n junction.

13. The energy conversion device of claim 1, wherein the solid-state junction is a conductor-dielectric, dielectric-dielectric, conductor-dielectric-conductor, or a dielectric-conductor-dielectric junction.

14. The energy conversion device of claim 1, wherein the porous semiconductor layer comprises a semiconductor material is chosen from a materials group including crystalline, polycrystalline, or porous $TiO_2$, $SrTiO_3$, $BaTiO_3$, $Sr_{.13-x}Ba_yTiO_z$, boron carbide, $LiNiO$, $Al_2O_3$, $ZnO$, and $LaSrVO_3$, and organic semiconductors comprising PTCDA, or 3,4,9,10-perylenetetracarboxylicacid-dianhydride.

15. The energy conversion device of claim 1, wherein the porous catalyst material comprises a nanoscopic conductor cluster, wherein the nanoscopic conductor cluster has discontinuous porous coverage over the porous semiconductor layer.

16. The energy conversion device of claim 1, wherein the energy conversion device is in an energy conversion system comprising a first energy conversion device as recited in claim 1 and a second energy conversion device as recited in claim 1, and wherein the first energy conversion device as recited in claim 1 and the second energy conversion device as recited in claim 1 are connected electrically in series or electrically in parallel.

17. The energy conversion device of claim 1, wherein the energy conversion device is in an energy conversion system comprising a first energy conversion device as recited in claim 1 and a second energy conversion device as recited in claim 1, and wherein the first energy conversion device as recited in claim 1 and the second energy conversion device as recited in claim 1 are connected thermally in series or thermally in parallel.

18. The energy conversion device of claim 1, comprising buss bars on the porous catalyst material with dimensions greater than tunneling tunneling dimensions of the porous catalyst material.

19. The energy conversion device of claim 16, wherein the energy conversion system further comprises a third energy conversion device as recited in claim 1, wherein the first energy conversion device as recited in claim 1, the second energy conversion device as recited in claim 1 and the third energy conversion device as recited in claim 1 are connected electrically in series, electrically in parallel, or combinations of series and parallel.

20. The energy conversion device of claim 17, wherein the energy conversion system further comprises a third energy conversion device as recited in claim 1, wherein the first energy conversion device as recited in claim 1, the second energy conversion device as recited in claim 1 and the third energy conversion device as recited in claim 1 are connected thermally in series, or thermally in parallel, or combinations of series and parallel.

* * * * *